US012813318B2

(12) United States Patent
Su et al.

(10) Patent No.: US 12,813,318 B2
(45) Date of Patent: Nov. 24, 2026

(54) PACKAGE ASSEMBLY AND METHOD OF ATTACHING MULTI-HEIGHT DIES/MODULES TO MULTI-CHIP ACTIVE/PASSIVE SUBSTRATE

(71) Applicant: Chipletz, Inc., Spicewood, TX (US)

(72) Inventors: Michael Su, Austin, TX (US); Siddharth Ravichandran, Austin, TX (US); Bryan Black, Spicewood, TX (US); Michael Alfano, Austin, TX (US)

(73) Assignee: Chipletz, Inc., Spicewood, TX (US)

( * ) Notice: Subject to any disclaimer, the term of this patent is extended or adjusted under 35 U.S.C. 154(b) by 882 days.

(21) Appl. No.: 17/829,252

(22) Filed: May 31, 2022

(65) Prior Publication Data

US 2023/0411174 A1 Dec. 21, 2023

(51) Int. Cl.
*H10W 74/01* (2026.01)
*H10P 72/70* (2026.01)
(Continued)

(52) U.S. Cl.
CPC ....... *H10W 74/014* (2026.01); *H10W 40/037* (2026.01); *H10W 40/22* (2026.01); *H10W 70/05* (2026.01); *H10W 70/095* (2026.01); *H10W 70/65* (2026.01); *H10W 70/685* (2026.01); *H10W 74/016* (2026.01); *H10W 74/019* (2026.01); *H10W 90/00* (2026.01);
(Continued)

(58) Field of Classification Search
CPC . H01L 21/561; H01L 21/568; H01L 21/4882; H01L 21/6836; H01L 23/5223; H01L 25/0655; H05K 1/0209; H05K 1/162
See application file for complete search history.

(56) References Cited

U.S. PATENT DOCUMENTS 6,955,481 B2 10/2005 Colgan
7,981,730 B2 7/2011 Tang et al.
(Continued)

OTHER PUBLICATIONS

Eric J. Suh et al., 2D, 2.1D, 2.5D, and 3D Package Studies in NEPP, Jet Propulsion Laboratory, California Institute of Technology, NASA Electronic Parts and Packaging Program (NEPP), 2019 Annual NEPP Electronic Technology Workshop (ETW), Jun. 18, 2019.
(Continued)

*Primary Examiner* — Erik Kielin
(74) *Attorney, Agent, or Firm* — Terrile, Cannatti & Chambers, LLP; Michael Rocco Cannatti

(57) ABSTRACT

A method and apparatus are provided for manufacturing a packaged assembly by attaching a plurality of multi-height integrated circuit components to an carrier or package substrate with embedded active and/or passive circuit elements and then forming an encapsulating molding compound to cover the multi-height integrated circuit components and then etching or grinding the encapsulating molding compound to expose each of the integrated circuit components at a planar heat dissipation surface so that a heat sink lid/cover can be formed with one or more thermal conductive layers to contact each of the exposed integrated circuit components, thereby enabling removal of heat from the integrated circuit components and the embedded active and/or passive circuit elements of the package substrate.

14 Claims, 9 Drawing Sheets

(51) Int. Cl.

| | |
|---|---|
| ***H10W 40/00*** | (2026.01) |
| ***H10W 40/22*** | (2026.01) |
| ***H10W 70/05*** | (2026.01) |
| ***H10W 70/65*** | (2026.01) |
| ***H10W 70/685*** | (2026.01) |
| ***H10W 90/00*** | (2026.01) |
| *H10W 74/00* | (2026.01) |
| *H10W 76/63* | (2026.01) |

(52) U.S. Cl.

CPC ...... *H10P 72/7402* (2026.01); *H10P 72/7416* (2026.01); *H10W 74/00* (2026.01); *H10W 76/63* (2026.01); *H10W 90/401* (2026.01); *H10W 90/701* (2026.01); *H10W 90/724* (2026.01); *H10W 90/734* (2026.01)

(56) References Cited

U.S. PATENT DOCUMENTS

| | | | | |
|---|---|---|---|---|
| 8,971,676 | B1 | 3/2015 | Thacker | |
| 9,250,403 | B2 | 2/2016 | Thacker | |
| 9,297,971 | B2 | 3/2016 | Thacker | |
| 9,335,500 | B2 | 5/2016 | McLaren | |
| 9,496,248 | B2 | 11/2016 | Lee | |
| 9,515,003 | B1 * | 12/2016 | Fitzgerald | G06F 1/20 |
| 9,847,271 | B2 | 12/2017 | Miura | |
| 10,001,611 | B2 | 6/2018 | Ding | |
| 10,025,047 | B1 | 7/2018 | Liu | |
| 10,354,958 | B2 | 7/2019 | Vincent | |
| 10,921,534 | B2 | 2/2021 | Dong | |
| 10,996,412 | B2 | 5/2021 | Perminjat | |
| 11,054,597 | B2 | 7/2021 | Raghunathan | |
| 11,094,682 | B2 | 8/2021 | Islam | |
| 11,107,770 | B1 | 8/2021 | Ramalingam | |
| 11,296,043 | B2 | 4/2022 | Kung | |
| 11,353,668 | B2 | 6/2022 | Erickson | |
| 11,417,698 | B2 | 8/2022 | Chang | |
| 11,493,689 | B2 | 11/2022 | Yu | |
| 11,527,419 | B2 | 12/2022 | Yu | |
| 11,598,927 | B1 | 3/2023 | Lin | |
| 11,762,155 | B2 | 9/2023 | Patel | |
| 11,841,541 | B2 | 12/2023 | Chang | |
| 11,894,354 | B2 | 2/2024 | Chen | |
| 11,899,251 | B2 | 2/2024 | Zhang | |
| 12,038,599 | B2 | 7/2024 | Yu | |
| 12,100,697 | B2 | 9/2024 | Lin | |
| 12,119,307 | B2 | 10/2024 | Chou | |
| 12,135,454 | B2 | 11/2024 | Yu | |
| 12,153,269 | B2 | 11/2024 | Pratap | |
| 12,191,257 | B2 | 1/2025 | Aggarwal | |
| 12,392,970 | B2 | 8/2025 | Karhade | |
| 12,412,879 | B2 | 9/2025 | Lau | |
| 2007/0152321 | A1 * | 7/2007 | Shi | H01L 25/0655 257/E23.101 |
| 2008/0182398 | A1 | 7/2008 | Carpenter et al. | |
| 2012/0207426 | A1 | 8/2012 | Doany | |
| 2014/0062607 | A1 * | 3/2014 | Nair | H01L 23/5389 361/679.02 |
| 2014/0112616 | A1 | 4/2014 | Numata | |
| 2015/0295098 | A1 | 10/2015 | Toda | |
| 2018/0299628 | A1 | 10/2018 | Liu | |
| 2019/0096840 | A1 * | 3/2019 | Ang | H01L 24/24 |
| 2021/0096310 | A1 | 4/2021 | Chang et al. | |
| 2021/0132309 | A1 | 5/2021 | Zhang et al. | |
| 2021/0159211 | A1 * | 5/2021 | Rubin | H01L 24/05 |
| 2021/0193549 | A1 * | 6/2021 | Eid | H01L 23/3677 |
| 2021/0407909 | A1 | 12/2021 | Jadhav | |
| 2022/0271019 | A1 | 8/2022 | Lin et al. | |
| 2022/0367431 | A1 | 11/2022 | Chen | |
| 2023/0081194 | A1 | 3/2023 | Lin et al. | |
| 2023/0088009 | A1 | 3/2023 | Karhade et al. | |
| 2024/0264369 | A1 | 8/2024 | Lin, Jr. | |
| 2024/0329339 | A1 | 10/2024 | Ecton | |

OTHER PUBLICATIONS

U.S. Appl. No. 17/692,587, filed Mar. 11, 2022, entitled Semiconductor Package with Integrated Capacitors.

Cyriel Minkenberg et al., Co-packaged datacenter optics: Opportunities and challenges, IET Optoelectronics, 2021; 15:77-91, accepted Sep. 16, 2020.

semiconductor-today.com, Optical transceiver market growing at 14% CAGR to $20.9bn in 2026, Jul. 2021.

PCT International Search Report and Written Opinion dated Aug. 5, 2024, for PCT/US2024/023645, Apr. 8, 2024.

PCT International Preliminary Report on Patentability for PCT/US2024/023645, Oct. 16, 2025.

* cited by examiner

PACKAGE ASSEMBLY AND METHOD OF ATTACHING MULTI-HEIGHT DIES/MODULES TO MULTI-CHIP ACTIVE/PASSIVE SUBSTRATE

BACKGROUND OF THE INVENTION

Field of the Invention

The present invention is directed in general to integrated circuit packages and methods of manufacturing same. In one aspect, the present invention relates to an integrated circuit package assembly with multiple integrated circuit dies or modules attached together on an interposer or substrate.

Description of the Related Art

Due to the increasing cost and complexity for manufacturing integrated chips with higher density requirements that are running up against lithographic reticle limits, there are increasingly practical ceilings on how large an integrated circuit die can be manufactured. Another manufacturing challenge is the increasing difficulty in integrating disparate functional blocks using different transistors nodes and back-end of line copper interconnect schemes on a single integrated circuit chip. In addition, increasing device density means that a single defect on a single IC chip can dramatically reduce the overall yield of the wafer used to manufacture the IC chip. One promising solution to improve yield and performance with reduced cost is to divide the overall circuit functionality among multiple smaller integrated circuits (or chiplets) having specialized functions. With this approach, the separate testing of the individual chiplets will result in smaller amount of silicon being rejected as defective than would be the case if the combined functionality were manufactured in a single chip, assuming a uniform fault distribution rate. However, this approach also requires extensive technical challenges with interconnecting multiple chiplets together, including longer signal routing paths with potentially higher losses, lower available bandwidth, higher power consumption and/or higher latency. Additional interconnect complications arise with different voltages, timing requirements, and protocols used by the chiplets, all of which make chiplets look like a less obvious approach.

One solution for addressing these challenges is to connect the chiplets into a single semiconductor package substrate, such as a common interposer or substrate, so that individually tested chiplets can be reassembled and packaged into a complete final SoC, thereby yielding a significantly larger number of functional SoCs. Such assemblies are referred to as System-in-Package (SiP) assemblies. An example of such a semiconductor package substrate is described in U.S. patent application Ser. No. 17/692,587 entitled "Semiconductor Package with Integrated Circuits" which was filed on Mar. 11, 2022, and which is incorporated herein by reference in its entirety as if fully set forth herein. The single semiconductor package substrate may be embodied as a silicon interposer or substrate having embedded passive or active components, such as a network of thin-film capacitors provided for vertical power delivery in a package where the capacitors are embedded in the package substrate core, thereby facilitating the connection of multiple ICs in a single package for critical AI workloads, immersive consumer experiences, and high-performance computing. While existing WLP approaches can provide interconnects between die pads with <50 um pitch and solder balls with ~0.5 mm pitch, there are processing costs and design constraints which constrain the ability of existing bumping technology solutions to achieve finer pitches while meeting the applicable performance, design, complexity and cost constraints for packing integrated circuit devices.

As will be appreciated, SiP assemblies have several advantages over a System-on-Chip (SoC), including the ability to combine many different IC chips (e.g., analog, digital, and radio frequency (RF) dice) in the same package, where each die is implemented using that domain's most appropriate technology process. Also, designers can employ a number of off-the-shelf dice coupled, perhaps, with a limited number of relatively small, internally-developed components. However, there are also challenges with combining disparate chips into a single packaged assembly since the individual die will often have different lateral and vertical dimensions, differing heat dissipation requirements, different pitch spacing requirements, etc. As a result, the existing solutions for providing SiP assemblies are extremely difficult at a practical level.

BRIEF DESCRIPTION OF THE DRAWINGS

The present invention may be understood, and its numerous objects, features and advantages obtained, when the following detailed description is considered in conjunction with the following drawings.

DETAILED DESCRIPTION

Figure 1:
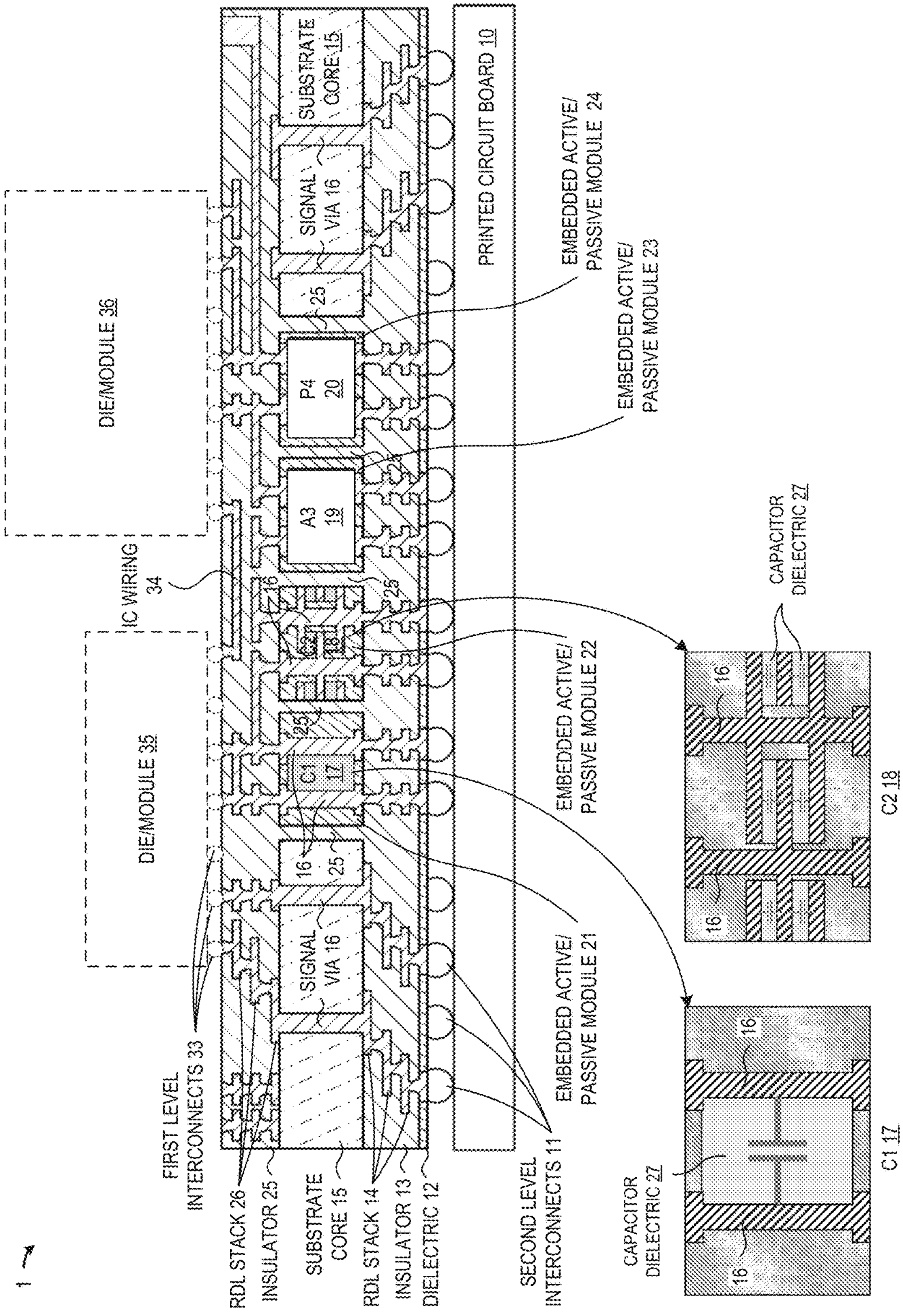
FIG. 1 is a cross-sectional view of a plurality of die/chip modules having different chip heights affixed to a multi-chip package substrate with embedded active and/or passive modules.

An integrated circuit package assembly and associated method of fabrication are disclosed for forming an integrated circuit package assembly with an encapsulated plurality of integrated circuit dice or chip modules attached to a package substrate with embedded active and/or passive circuit elements or devices and also attached to a heat sink lid/cover that is formed on and thermally connected to the encapsulated integrated circuit dice/chip modules with one or more thermal conductive layers to contact the integrated circuit dice/chip modules and the package substrate, thereby enabling removal of heat from the integrated circuit dice/chip modules and the embedded circuit elements in the package substrate. In selected die-level reconstitution embodiments, a plurality of multi-height integrated circuit dice or chip modules are attached to a first temporary carrier and encapsulated with a molding compound which is then grinded to expose the integrated circuit dice or chip modules at a flat heat dissipation surface, and then the encapsulated and grinded integrated circuit dice or chip modules are transferred to a second temporary carrier to form an assembly interface of interconnect conductor structures (e.g., microbumps, C4 bumps, solder balls, Cu—Cu joint, Nano sintered silver or Cu, etc.) on the integrated circuit dice or chip modules before being transferred to a dicing tape for singulation into individual modules which may be attached to a package substrate with embedded active and/or passive circuit elements so that a heat sink lid/cover can be formed with one or more thermal conductive layers to contact at least the exposed integrated circuit dice/chip modules. In other die-level reconstitution embodiments, a plurality of multi-height integrated circuit dice or chip modules having an assembly interface of interconnect conductor structures are attached to a temporary carrier and encapsulated with a molding compound which is then grinded to expose the integrated circuit dice or chip modules at a flat heat dissipation surface, and then the encapsulated and grinded integrated circuit dice or chip modules are transferred to a dicing tape for singulation into individual modules which may be attached to a package substrate with embedded active and/or passive circuit elements so that a heat sink lid/cover can be formed with one or more thermal conductive layers to contact at least the exposed integrated circuit dice/chip modules. In other die-level reconstitution embodiments, each grouping of multi-height integrated circuit dice/chip modules may be surrounded by a thermally conductive stiffener ring when mounted to the carrier or package substrate(s) before performing the mold compound encapsulation and grinding so that a thermally conductive heat sink lid/cover is formed to contact each of the exposed IC dice/chip modules and the embedded active and/or passive circuit elements in the package substrate(s) through the stiffener ring.

In selected substrate-level reconstitution embodiments, a panel of package substrates with embedded active and/or passive circuit elements are attached to a temporary carrier and then a plurality of multi-height integrated circuit dice or chip modules with an assembly interface of interconnect conductor structures are attached to each of the package substrates and encapsulated with a molding compound which is then grinded to expose the integrated circuit dice or chip modules at a flat heat dissipation surface, and then the encapsulated and grinded panel of integrated circuit dice or chip modules are transferred to a dicing tape for singulation into individual modules which may be attached to a heat sink lid/cover with one or more thermal conductive layers to contact at least the exposed integrated circuit dice/chip modules. In other selected substrate-level reconstitution embodiments, the integrated circuit package assembly may be formed by attaching a panel of multi-height integrated circuit dice/chip modules and a thermally conductive, surrounding stiffener ring to one or more carrier-mounted package substrates having embedded active and/or passive circuit elements, encapsulating the panel in a molding compound to cover the multi-height IC die/chip modules and stiffener ring, grinding the molding compound down to expose the IC dice/chip modules and surrounding stiffener ring at a uniform height, and then forming a heat sink lid/cover with one or more thermal conductive layers to contact each of the exposed IC dice/chip modules and the embedded active and/or passive circuit elements in the package substrate(s) through the stiffener ring, and then singulating the encapsulated panel/package substrate(s) into individual integrated circuit package assemblies. As will be appreciated, the singulation process may use a cut line or dicing line that extends through the substrate, or just through the molding compound between two substrates, and the cut line may be flushed to the molded stiffener, or the molded stiffener may be recessed from the cut line In selected warpage-correcting embodiments, a warped package substrate with conductive landing pads is processed to selectively form one or more conductive landing pad extension layers on the conductive landing pads (e.g., on the periphery or in the center or with a combination or in concentric bands) prior to attaching individual integrated circuit dice or chip modules to the warped package substrate. As disclosed herein, the landing pad extension layer(s) may be formed with any suitable conductive material, including but not limited to solder, Cu paste, Ag paste, metal, metal alloy, direct metal-to-metal bonding, thermal paste, thermal pad, etc. By properly placing the location of the selectively formed additional landing pad extension layer(s) on the conductive landing pads of the warped package substrate, solid electro-physical connections are established between the conductive landing pads and the assembly interface of interconnect conductor structures on each IC die/chip module. In other warpage-correcting embodiments, a warped package substrate may include one or more magnetic stiffener rings or elements formed on the package substrate, either before or after attaching the IC dice/chip modules to the warped package substrate. By properly locating the magnetic stiffener rings or elements, the warped package substrate may be de-warped or straightened during assembly by temporarily or permanently magnetizing the magnetic stiffener rings or elements with a magnetic chuck table or other suitable magnetic field generator, thereby straightening out the package substrate during assembly.

Various illustrative embodiments will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a package assembly without including every device feature or geometry in order to avoid limiting or obscuring the present invention. It is also noted that, throughout this detailed description, certain materials will be formed and removed to fabricate the package assembly structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Turning now to FIG. 1, there is depicted a cross-sectional view of an integrated circuit package assembly 1 wherein a plurality of die/chip modules 35, 36 having different chip heights are affixed to a multi-chip package substrate 12-26 with embedded active and/or passive modules 21-24. As depicted, the integrated circuit package assembly 1 is implemented as a flip chip package wherein the die/chip modules 35, 36 are connected to one another and to the printed circuit board 10 using defined conductive elements and the embedded active and/or passive modules in the package substrate 12-26. In particular, the flip chip package assembly has a plurality of surface-attachable die or module devices 35, 36 which are shown as having different device heights. The depicted die/module devices 35, 36 are attached to a first or top surface of the multi-chip package substrate 12-26 using a set of first level interconnects 33, such as solder bumps or microbump conductors. In similar fashion, a second or bottom surface of the multi-chip package substrate 12-26 is attached to the printed circuit board 10 using a set of second level interconnects 11, such as a plurality of solder balls or bumps. As will be appreciated, the first and second level interconnects 33, 11 are not restricted to solder balls/bumps, and can include land grid array (LGA), ball grid array (BGA), etc.

To support and enable electrical connection between the die/chip modules 35, 36 and the printed circuit board 10, the package substrate 12-26 includes a substrate core 15 that is formed with an insulating material (e.g., plastic and/or fiberglass) that is sandwiched between first and second redistribution line (RDL) stacks 25-26, 13-14. In the substrate core 15, one or more embedded active and/or passive modules 21-24 are formed. As illustrated, a plurality of embedded active and/or passive modules 21-24 may be separately formed in separate cavities of the substrate core 15 to be isolated from one another by an intervening insulation layer 25, but in other embodiments, the embedded active and/or passive modules 21-24 may be formed in a single continuous cavity of the substrate core 15.

As depicted, the embedded active and/or passive modules 21-24 may include a variety of different circuit components may take any suitable form, shape, size, thickness, or structure. In addition, one or more of the embedded active and/or passive modules 21-24 can be positioned in alignment with an outline or power domain of an IC die/chip module 35, 36. For example, there may be design and performance benefits from aligning the position of one or more surface attachable devices (e.g., die/module 35) so that has a "shadow" within which the underlying embedded circuit components (e.g., capacitors) C1 17 and C2 18) are located. As a result, each embedded circuit component can follow the physical layout or profile of each domain/functional block of a single surface attachable device. While one or more embedded circuit components can be positioned to service a single surface attachable device under its shadow, the connections between the capacitors and surface attachable devices through the package RDL stack 26 can also allow an embedded circuit component to service multiple surface attachable devices.

By way of providing examples of different embedded circuit components, the first embedded module 21 is depicted as including a first vertical planar capacitor C1 17 which may be, for example, a power delivery capacitor. As depicted with the enlarged image of the embedded component 21, the capacitor C1 17 that is embedded in the substrate core 15 includes a pair of capacitor plates formed from the conductive via structures 16 which are separated by a capacitor dielectric 27. In addition, the second embedded module 22 is depicted as including a second vertical multilayer capacitor C2 18. As depicted with the enlarged image of the embedded component 22, the capacitor C2 18 that is embedded in the substrate core 15 is constructed with sandwiched capacitor plate layers 18 including interleaved conductive fingers 28 which are attached to the conductive via structures 16 and separated by a capacitor dielectric 29. Thus, it will be appreciated that any suitable capacitor can be embedded, including a multi-layer ceramic capacitor (MLCC), thin-film based (Al, Ta, etc.), polymer-cap, etc., and can include a combination of different types of capacitors for different voltages (1.2 V, 5V, 100V depending on the capacitor), frequencies, and densities. To provide another example of an embedded circuit component, the third embedded module 23 is depicted as including a third active circuit component A3 19, which may include an integrated circuit die for implementing a specified power, RF, digital and/or photonic functionality, such as filtering power noise, converting and/or regulating regulate voltage, assisting with die-to-die communication, etc. And to provide another example of an embedded circuit component, the fourth embedded module 24 is depicted as including a fourth passive circuit component P4 20, which may include any type of passive component, such as a capacitor, resistor, inductor, etc.

By forming at least a portion of the substrate core 15 with embedded capacitor(s), at least some of the vertical connections in the first and second RDL stacks 26, 14 can connect the capacitor(s) to the external circuitry on the PCB 10 and at least one of the attachable IC die/chip modules 35, 36 for filtering AC noise from the DC power. Moreover, embedding or forming the substrate core 15 with the capacitor(s) and providing vertical delivery of DC power through the capacitor(s) avoids RC signal delays and poor device density resulting from the use of decoupling capacitors having terminals on left and right sides for lateral power delivery and signal routing through the capacitor or placement of the capacitor on the surface of the package.

The substrate core 15 also includes one or more defined conductive signal or power via elements 16 to provide electrical and/or thermal conductive paths to and from the substrate core 15 and the embedded active and/or passive modules 21-24. The conductive signal or power via elements 16 may be formed as conductive via structures which extend through the substrate core 15 and which have top and bottom terminal landing pads. At least one of the conductive via elements 16 is provided for vertically passing DC power from the external circuitry 10 to one or more of the die/chip modules 35, 36, either directly or through one of the embedded active/passive modules 21-24 (e.g., capacitor C1). In selected embodiments, each conductive signal or power via element 16 may be embodied as a plated-through hole (PTHs).

On a first or top surface of the substrate core 15, the package substrate 12-26 includes a first redistribution line (RDL) stack of conductive elements 26 formed in one or more first insulator layer(s) 25 to connect the set of first level interconnects 33 to the defined conductive signal or power via elements 16 and embedded active and/or passive modules 21-24. When used for interconnecting to the IC die/chip modules 35, 36, the first RDL stack 26 may have fine-pitch routing layers. In addition, one or more fine-pitch IC wiring lines 34 can also be provided in the first RDL stack for signaling between the die/chip modules 35, 36. And on a second or bottom surface of the substrate core 15, the package substrate 12-26 includes a second RDL stack of conductive elements 14 formed in one or more second insulator layer(s) 13 to connect the set of second level interconnects 11 to the defined conductive signal or power via elements 16 and embedded active and/or passive modules 21-24. When used for interconnecting to the second level interconnects 11, the second RDL stack 14 may have a few course-pitch routing layers for power or I/O connections to the PCB 10. With the RDL stacks 26, 14, the conductive elements 16, 21-24 in the substrate core 15 are extended to make electrical contact, respectively, with the first and second level interconnects 33, 11, thereby forming interconnections than can be accommodated by the individual die size of the IC die/chip modules 35, 36. As a result of the configurations of the first and second RDL stacks 26, 14, terminal metals can be extremely close to each other, allowing small pitch first level interconnect microbumps 33 (e.g., 80 micron pitch) to vertically align with second level interconnect solder balls 11 without laterally routing of DC power lines through the RDL stacks 14, 26.

As will be appreciated, the die/module devices 35, 36 can be integrated circuit devices, integrated passive devices, microelectromechanical systems (MEMS). However, when different die/chip module devices 35, 36 having different heights are attached to the package substrate 12-26, this results in a number of packaging and performance challenges. For example, when the IC die/chip module 35 is shorter than the IC die/module 36, the different heights cause non-planar encapsulation profiles which can adversely affect chip handling, assembly, and placement. Another packaging and performance challenge resulting from having multi-height IC die/chip modules 35, 36 is that there is uneven thermal dissipation and heat transfer from the die/module devices 35, 36 since conventionally formed heat sink lid/covers are not in direct thermal contact with the IC die/chip modules 35, 36 due to their differing heights.

To illustrate an example sequence of process steps for fabricating an integrated circuit package assembly in accordance with selected die-level reconstitution embodiments of the present disclosure, reference is now made to FIGS. 2*a-i* which show cross-sectional views of various manufacturing process steps for attaching a plurality of integrated circuit dice 101-109 and a heat sink lid/cover 133 to a multi-chip package substrate 118 having embedded active and/or passive circuit elements. In the process flow for this die-level reconstitution embodiment, the unbumped integrated circuit dice 101-109 are reconstituted on a first temporary carrier for molding and grinding before being transferred to a second temporary carrier so that the assembly interface 113 (e.g., microbump conductors, solder, Cu joint, etc.) may be formed on the individual integrated circuit dice 101-109 prior to singulation and attachment to a package substrate.

Figure 2A:
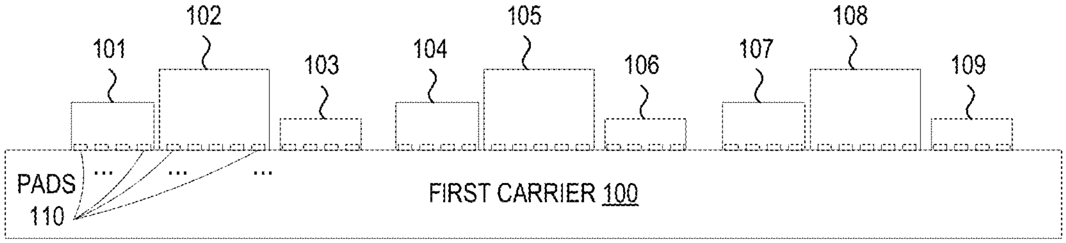
FIGS. 2*a-i* depict cross-sectional views of a sequence of fabrication steps for attaching a plurality of integrated circuit dice and a heat sink lid/cover to a multi-chip package substrate in accordance with selected first die-level reconstitution embodiments of the present disclosure.

As depicted in FIG. 2*a*, a first carrier or holder or panel 100, such as a glass carrier, is provided. In selected embodiments, the first carrier 100 may include a raised outer peripheral frame portion (not shown) which provides a mold frame function during subsequent processing steps. A plurality of integrated circuit dice 101-109 having different heights are attached to the first carrier 100 that have been inspected and attached in an array configuration using any appropriate attach method, such as an adhesive layer (not shown). As depicted, the IC dice 101-109 may be any surface-mountable devices (IC, passives, modules of ICs, IC stacks, etc.) that are attached into regular dice groupings, with dice 101-103 having different heights forming a first group, with dice 104-106 having different heights forming a second group, and with dice 107-109 having different heights forming a third group. As depicted, each die 101-109 includes a first or bottom surface having connector terminals or conductive landing pads 110, but at this point in the fabrication process, there are no microbump conductors attached to the landing pads 110. Although any suitable method may be used to position the integrated circuit dice 101-109 onto the first carrier 100, in one embodiment, a conventional pick-and-place machine is used in positioning the integrated circuit dice 101-109. As disclosed herein, each IC die component (e.g., 101) may be any type of circuit, such as an integrated circuit device, integrated passive device, microelectromechanical systems (MEMS), capacitor, resistor, inductor, or other passive device, and may also include one or more active circuit components, such as one or more switching transistors or more complex circuits that perform any other type of function. Thus, the plurality of integrated circuit dice 101-109 are not limited to a particular technology and need not be derived from any particular wafer technology.

Figure 2B:
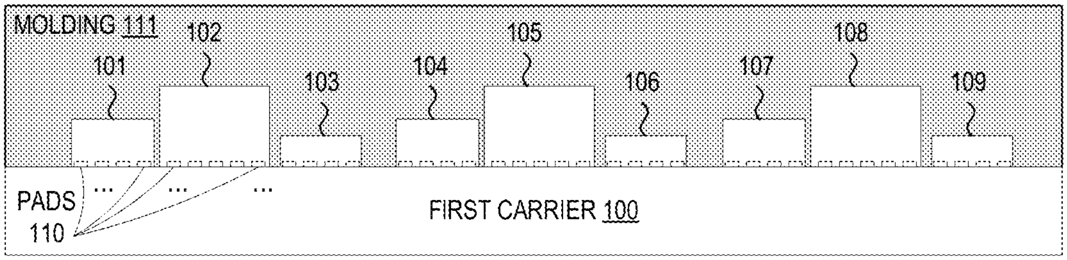

FIG. 2*b* illustrates a cross-sectional view of the panelized IC dice 101-109 after additional processing is applied to encapsulate the IC dice 101-109 in accordance with selected embodiments of the present disclosure. As depicted, a molding material is applied to completely cover the multi-height IC dice 101-109 affixed to the first carrier 100, thereby forming an encapsulant or molding compound body 111 that encapsulates the multi-height IC dice 101-109 within the molding material and forms a panel. The molding material can be any appropriate encapsulant having properties that are suitable for providing mechanical support and structural integrity to maintain the physical arrangement of the IC dice 101-109, including during the subsequent grinding or etching process (described below). For example, the molding material may use silica-filled epoxy molding compounds, plastic encapsulation resins, and other polymeric materials such as silicones, polyimides, phenolics, and polyurethanes. The molding material can be applied by a variety of standard processing techniques used in encapsulation including, for example, printing, pressure molding, injection molding, film-assisted molding, and spin application. Once the molding material is applied, the panel can be cured by exposing the materials to certain temperatures for a period of time, or by applying curing agents, or both. In the encapsulation process, the depth of the molding compound body 111 should exceed a maximum height of the IC dice 101-109 being embedded, or could be at least the height of the shortest of the IC dice 101-109.

Figure 2C:
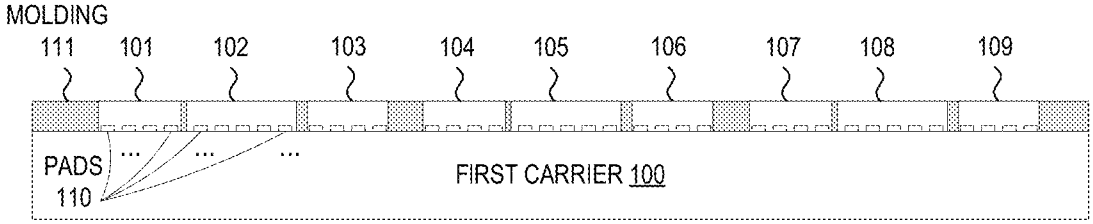
Figure 2D:
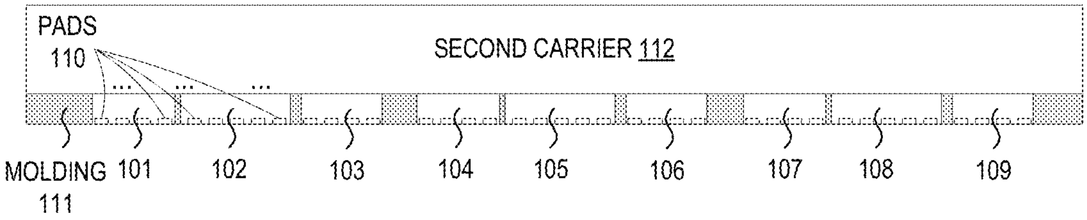
Figure 2E:
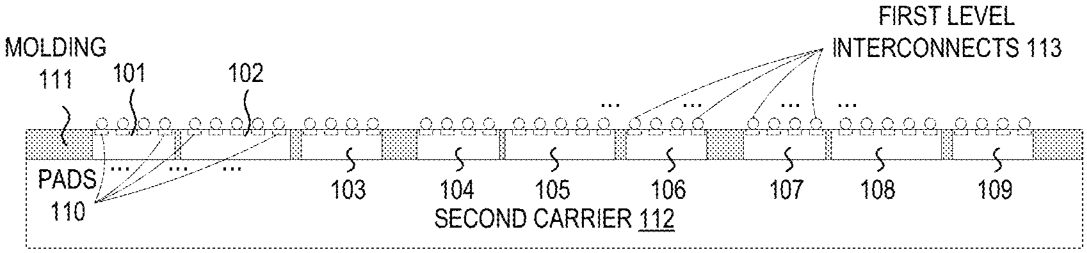
Figure 2F:
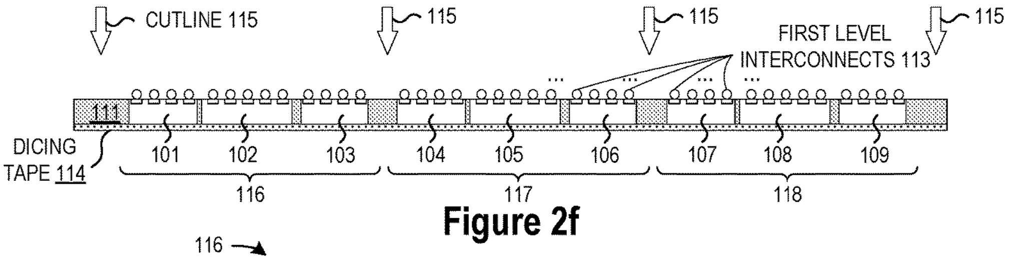
Figure 2G:
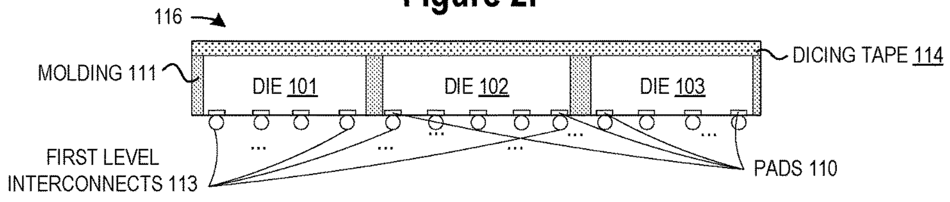
Figure 2H:
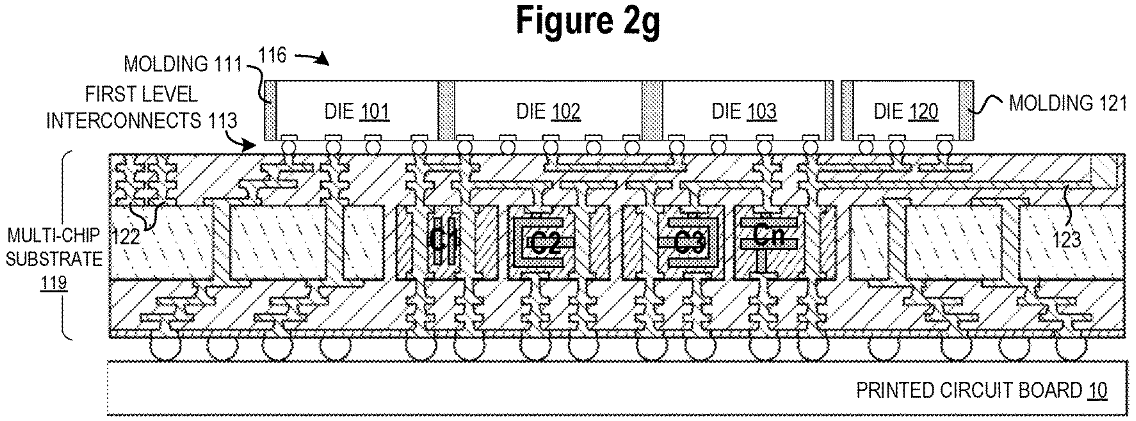

FIG. 2*c* illustrates a cross-sectional view of the encapsulated panel of IC dice 101-109 after additional processing is applied to grind or etch the encapsulated panel 101-111 to achieve a desired panel thickness to expose the IC dice 101-109 at a flat heat dissipation surface in accordance with selected embodiments of the present disclosure. As disclosed herein, a grinding or etching process may be applied to reduce the thickness of the encapsulant or mold compound body 111 to a desired panel thickness which exposes the shortest of the IC dice 101-109. As will be appreciated, the grinding or etching process must be capable of removing not only an upper portion of the molding compound body 111, but also the upper portions of any of the IC dice 101-109 which are taller than then shortest die. In addition, the grinding/etching process may be applied to remove the molding compound body 111 along with the upper portions of all of the IC dice 101-109 so that each of the IC dice 101-109 have the same height. This reduction in thickness of the encapsulant 111 and any etched dice 101-109 can be performed by a grinding process, chemical etching, laser ablation, or other suitable techniques (e.g., back grinding), and is carefully controlled (e.g., with a timed etch or grind process) to prevent the integrated circuit elements formed at the first or bottom surface of the IC dice 101-109 from being reached, impaired, or damaged. While the grinding process may be applied to reduce the height of the raised outer peripheral frame portion (not shown) on the first carrier 100, this can be readily avoided by removing the raised outer peripheral portion or transferring the encapsulated panel of IC dice 101-109 to another carrier prior to grinding. In addition, the grinding or etching process should be applied in a controlled way to remove material from the top of the molding compound body 111 and dice 101-109 without disturbing the mechanical and structural integrity of the IC dice 101-109 or their attachment to the first carrier 100. As a result of the grinding process, each of the IC dice 101-109 and the molding compound 111 have the same height.

FIG. **2*d* illustrates a cross-sectional view of the etched panel of encapsulated IC dice 101-111 after additional processing is applied to release and mount the etched panel of encapsulated IC dice 101-111 on a second carrier 112 in accordance with selected embodiments of the present disclosure. As a preliminary step, the etched panel of encapsulated IC dice 101-111 is removed or released from the first carrier 100. Once released, the first or bottom side of the etched panel of encapsulated IC dice 101-111 previously attached to the first carrier 100 may be cleaned to remove any adhesive and otherwise clear and expose the ends of connector terminals/landing pads 110. At this point, a second or top surface of the etched panel of encapsulated IC dice 101-111 is attached or mounted to a second process carrier or holder or panel 112 using any appropriate attachment technique method. As mounted, the connector terminals/landing pads 110 for each IC die (e.g., 101) are exposed on a bottom surface of the mounted etched panel of encapsulated IC dice 101-111**.

FIG. **2*e* illustrates a cross-sectional view of the mounted etched panel of encapsulated IC dice 101-111 after additional processing is applied to form first level interconnect conductors 113 in accordance with selected embodiments of the present disclosure. As a preliminary step, the mounted etched panel of encapsulated IC dice 101-111 is turned over or flipped or otherwise positioned so that the exposed connector terminals/landing pads 110 may attached to an assembly interface of microbump conductors which form a set of first level interconnects 113. For example, ball grid array conductors 113 are shown as being formed on the exposed surface of the mounted etched panel of encapsulated IC dice 101-109 to be electrically connected via the connector terminals/landing pads 110 to the IC die 101-109, though it will be appreciated that selected ball grid array conductors 113** may be electrically connected through conductive traces (not shown).

FIG. **2*f* illustrates a cross-sectional view of the mounted etched panel of encapsulated IC dice 101-111 and first level interconnects 113 after additional processing is applied to singulate the mounted etched panel of encapsulated IC dice 101-111 into individual modules 116-118 in accordance with selected embodiments of the present disclosure. As a preliminary step, the mounted etched panel of encapsulated IC dice 101-111 is removed or released from the second carrier 112 and then remounted on a dicing tape 114 that is used to hold the panel during saw operations and to hold the subsequently singulated modules 116-118 formed after saw operations. As will be appreciated, individual modules 116-118 may be singulated with a saw or laser or other cutting device 115 that is applied along defined saw cut lines or scribe grids (not shown) to cut down through the first level interconnects 113 and mounted etched panel of encapsulated IC dice 101-111 and into the dicing tape 114. By cutting down to, but not through, the dicing tape 114, the singulated modules 116-118 remain attached to dicing tape 114** until subsequently removed.

FIG. **2*g* illustrates an enlarged cross-sectional view of the individual module 116 after additional processing is applied to singulate, release, and flip the singulated module 116 in accordance with selected embodiments of the present disclosure. As illustrated, the individual module includes a plurality of IC die or chip modules 101-103 which are encapsulated in a molding compound 111 and etched or grinded to a uniform height. The upper surface of the IC dice or chip modules 101-103 is attached to the dicing tape segment 114, and the lower surface of each of the IC dice or chip modules 101-103 includes an exposed connector terminals/landing pads 110 and attached first level interconnect microbumps 113**.

FIG. **2*h* illustrates a cross-sectional view of the individual module 116 after additional processing is applied to form a package assembly by attaching the singulated module 116 to a multi-chip package substrate 119 and then removing the dicing tape 214 in accordance with selected embodiments of the present disclosure. As a preliminary step, the individual module 116 is attached to the multi-chip package substrate 119 with their active sides facing the multi-chip package substrate 119 using any suitable attachment technique. At the same time, one or more additional IC die/chip module 120, 121 may also be affixed or attached to the multi-chip package substrate 119. While any suitable die attach process may be used, the singulated module 116 may be attached by aligning the first level interconnects 113 to the terminal metals of the first RDL stack 26 to make an electrical connection using flip chip bumps or other appropriate die attach method, such as mass reflow, thermo-compression bonding, laser-assist bonding, direct and hybrid bonding, etc. In addition, an underfill material or layer (not shown) may be formed or injected between the individual module 116 and multi-chip package substrate 119**.

As illustrated, the multi-chip package substrate 119 is similar to the multi-chip package substrate 12-26 depicted in FIG. 1, so the reference numbering for the constituent components and layers in the multi-chip package substrate 12-26 are not repeated. However, the multi-chip package substrate 119 may include one or more additional thermal conduction paths 122, 123 formed with the first RDL stack 26. For example, a first thermal conduction path may include one or more thermal vias 122 formed with one or more conductive layers that are constructed in the first insulator layer(s) 25 to connect any heat dissipation paths (not shown) in the substrate core 15 to the first or top surface of the multi-chip package substrate 119. In addition or in the alternative, a second thermal conduction path may include a thermal conduction trench and one or more thermally conductive RDL elements 123 constructed in the first insulator layer(s) 25 to connect embedded active/passive elements 21-24 to the first or top surface of the multi-chip package substrate 119.

Figure 2I:
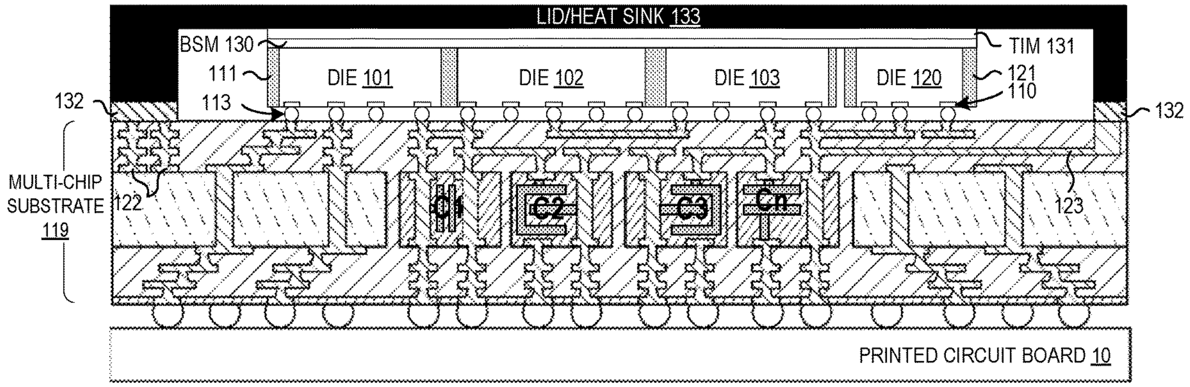

FIG. 2*i* illustrates a cross-sectional view of the individual module 116 after additional processing is applied to attach or mount a heat spreader lid or heat sink cover 133 on the package assembly in accordance with selected embodiments of the present disclosure. As a preliminary step, one or more backside metallization (BSM) layers 130 may be formed as patterned thermal interface material layers that are selectively formed or applied on the exposed surface(s) of the chip module(s) 116, 120-121 to make direct, thermal conduction contact with the IC dice or chip modules 101-103, 120. In addition, one or more patterned thermal interface material (TIM) layers 131 may be selectively formed or applied on an exposed surface of each of the module(s) 116, 120-121 using a compliant, thermally conductive grease or non-curing silicon material to minimize the thermal resistance between the modules and the subsequently attached heat spreader lid array, and to protect the IC dice or chip modules 101-103, 120 from compression-related damage. Subsequently, a single heat spreader lid 133 is formed with thermally conductive material such as, for example, copper (e.g., CDA194 copper) or other copper alloy, nickel iron alloy (e.g., Alloy 42) or other Ni alloys, and the like. The depicted heat spreader lid 133 is placed in registry with and attached to directly thermally contact the plurality of IC dice or chip modules 101-103, 120 using the patterned TIM layer 131 and BSM layer 130 as thermally conductive layers. In selected embodiments, the heat spreader lid 133 may be formed with a variety of different structures as part of a planar or non-planar array of heat spreader lids, provided that the heat spreader lid 133 includes a planar portion which is in direct physical contact with the IC dice or chip modules 101-103, 120 through the TIM and BSM layers 130, 131 to enable thermal dissipation through the head spreader lid as a heat sink. In other embodiments, the heat spreader lid 133 may be formed to include a thermally conductive adhesive layer 132 which is used to attach the heat spreader lid 133 to one or more thermal conduction paths 122, 123 formed in the multi-chip package substrate 119. For example, the thermally conductive adhesive layer 132 may be a TIM film or tape and applied to the bottom surface of each heat spreader lid 133, with the TIM layer 132 then making contact with the top thermal conduction paths 122, 123 formed in the multi-chip package substrate 119 when the heat spreader array 133 is aligned and placed in registry.

To ensure that the plurality of IC dice or chip modules 101-103, 120 make direct thermal contact to the heat spreader lid 133 via the TIM and BSM layers 130, 131, the vertical or height dimensions of the interior cavity space in the head spreader lid 133 are controlled or specified to be equal to, or slightly less than, the combined height of the interconnect conductors 113, the IC dice or chip modules 101-103, 120, the BSM layer 130, and the TIM layer 131. And by using a compressible or compliant TIM layer(s) 131, 132, the exertion of downward clamp force to compress the heat spreader lid 133 against the multi-chip substrate 119 causes the IC dice or chip modules 101-103, 120 to make direct thermal contact with the heat spreader lid 133 without exerting excessive compression forces that could damage or crack the IC dice or chip modules 101-103, 120. The use of a compressible or compliant TIM layer(s) 131, 132 also effectively absorbs thickness variability in the package assembly components.

To illustrate an example sequence of process steps for fabricating an integrated circuit package assembly in accordance with selected second die-level reconstitution embodiments of the present disclosure, reference is now made to FIGS. 3*a-e* which show cross-sectional views of various manufacturing process steps for attaching a plurality of integrated circuit dice 211-219 and a heat sink lid/cover to a multi-chip package substrate 230 having embedded active and/or passive circuit elements. In the process flow for this die-level reconstitution embodiment, the assembly interface 203 (e.g., microbump conductors, solder, Cu joint, etc.) is formed on individual integrated circuit dice 211-219 prior to reconstitution on temporary carrier, molding, grinding, singulation and attachment to a package substrate.

Figure 3A:
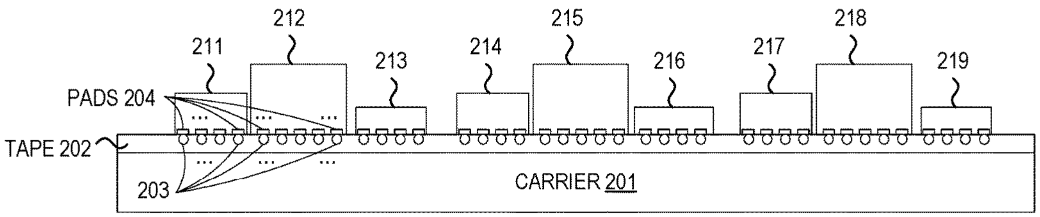
FIGS. 3*a-e* depict cross-sectional views of a sequence of fabrication steps for attaching a plurality of integrated circuit dice and a heat sink lid/cover to a multi-chip package substrate in accordance with selected second die-level reconstitution embodiments of the present disclosure.

As depicted in FIG. 3*a*, a first carrier or holder or panel 201, such as a glass substrate, is provided. In addition, a plurality of bumped integrated circuit dice 211-219 having different heights are provided and attached to the first carrier 201 using an adhesive tape layer 202. As depicted, each die 211-219 includes a first or bottom surface having connector terminals or conductive landing pads 204 which are connected to corresponding microbump conductors 203. Any suitable method may be used to position the integrated circuit dice 211-219 onto the first carrier 201, such as using a pick-and-place machine to position the integrated circuit dice 211-219 on the tape 202.

Figure 3B:
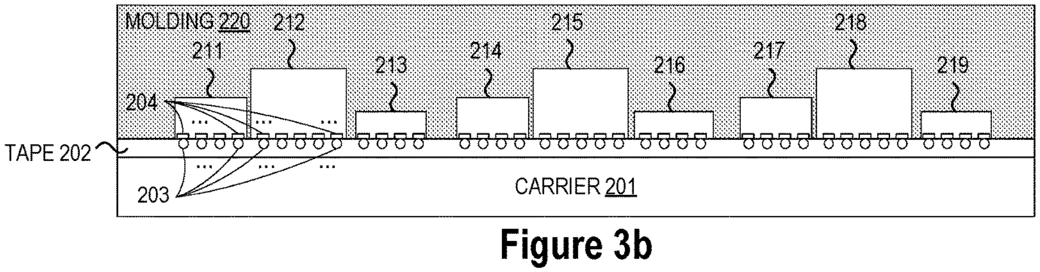

FIG. 3*b* illustrates a cross-sectional view of the panelized IC dice 211-219 after additional processing is applied to encapsulate the IC dice 211-219 in accordance with selected embodiments of the present disclosure. As depicted, a molding material is applied to completely cover the multi-height IC dice 211-219 affixed to the first carrier 201, thereby forming an encapsulant or molding compound body 220 that encapsulates the multi-height IC dice 211-219 within the molding material and forms a panel. The molding material can be any appropriate material (such as a silica-filled epoxy molding compound, plastic encapsulation resin, and other polymeric material) and can be applied by a variety of standard processing techniques used in encapsulation including (such as printing, pressure molding, injection molding, film-assisted molding, and spin application) and then cured by exposing the materials to certain temperatures for a period of time, or by applying curing agents, or both. In the encapsulation process, the depth of the molding compound body 220 should exceed a maximum height of the IC dice 211-219 being embedded, or could be at least the height of the shortest of the IC dice 211-219.

Figure 3C:
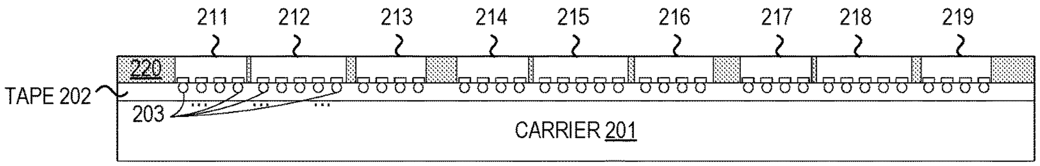

FIG. 3*c* illustrates a cross-sectional view of the encapsulated panel of IC dice 203-204, 211-219 after additional processing is applied to grind or etch the encapsulated panel 211-220 to achieve a desired panel thickness to expose the IC dice 211-219 at a flat heat dissipation surface in accordance with selected embodiments of the present disclosure. As disclosed herein, a grinding or etching process may be applied to reduce the thickness of the encapsulant or mold compound body 220 to a desired panel thickness which exposes the shortest of the IC dice 211-219. As will be appreciated, the grinding or etching process must be capable of removing not only an upper portion of the molding compound body 220, but also the upper portions of any of the IC dice 211-219 which are taller than then shortest die so that each of the IC dice 211-219 have the same height. To reduce the thickness of the encapsulant 220 and any etched dice 211-219, any suitable grinding or etching process may be used, such as mechanical grinding, chemical etching, laser ablation, or other suitable techniques (e.g., back grinding), that is carefully controlled to prevent the integrated circuit elements formed at the first or bottom surface of the IC dice 211-219 from being reached, impaired, or damaged. As a result of the grinding process, each of the IC dice 211-219 and the molding compound 220 have the same height and the mechanical and structural integrity of the IC dice 211-219 and their attachment to the first carrier 201 is not disturbed.

Figure 3D:
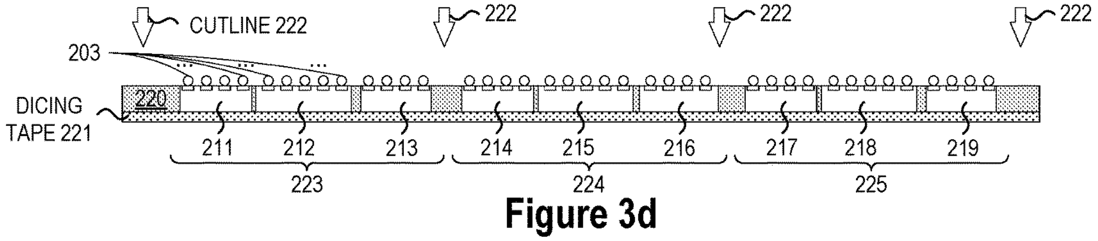

FIG. 3*d* illustrates a cross-sectional view of the etched panel of encapsulated IC dice 211-220 after additional processing is applied to singulate the etched panel of encapsulated IC dice 211-220 into individual modules 223-225 in accordance with selected embodiments of the present disclosure. As a preliminary step, a second or top surface of the etched panel of encapsulated IC dice 211-220 is attached or mounted to a dicing tape or adhesive layer 211 that is used to hold the panel during saw operations and to hold the subsequently singulated modules 223-225 formed after saw operations. In addition, the assembly is turned over or flipped or otherwise positioned so that the adhesive tape layer 202 and first carrier 201 can be removed or released, thereby exposing the connector terminals/landing pads 204 and microbump conductors 203. Once released, the side of the etched panel of encapsulated IC dice 211-220 previously attached to the first carrier 201 may be cleaned to remove any adhesive and otherwise clear and expose the connector terminals/landing pads 204 and microbump conductors 203. In addition, one or more cutting or sawing processes 222 are applied to singulate the etched panel of encapsulated IC dice 211-220 into individual modules 223-225, such as by using a saw or laser or other cutting device that is applied along defined saw cut lines 222 or scribe grids (not shown) to cut down through the etched panel of encapsulated IC dice 211-220 and into or through the dicing tape 221.

Figure 3E:
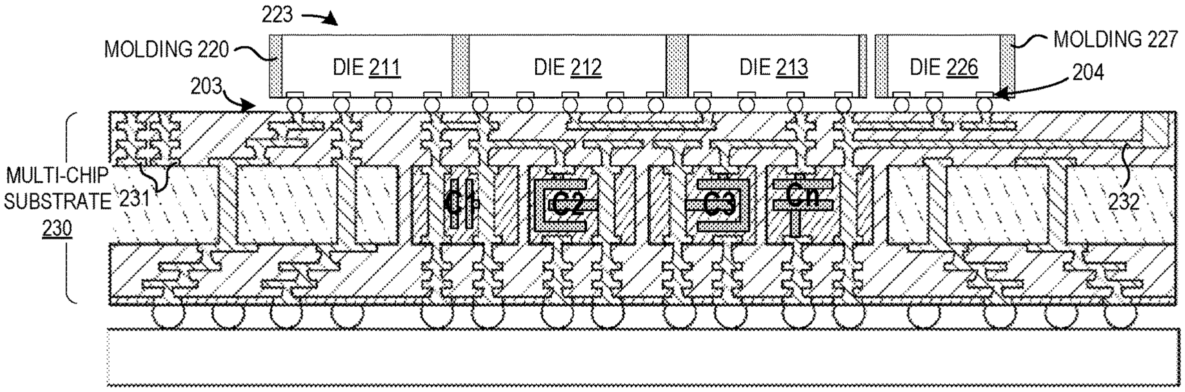

FIG. 3*e* illustrates a cross-sectional view of the individual module 223 after additional processing is applied to form a package assembly by attaching the singulated module 223 to a multi-chip package substrate 230 and then removing the dicing tape 221 in accordance with selected embodiments of the present disclosure. As a preliminary step, the individual module 223 is attached to the multi-chip package substrate 230 with their active sides facing the multi-chip package substrate 230 using any suitable attachment technique. At the same time, one or more additional IC die/chip module 226, 227 may also be affixed or attached to the multi-chip package substrate 230. While any suitable die attach process may be used, the singulated module 223 may be attached by aligning the microbump conductors 203 to the terminal metals of the first or RDL stack in the package substrate 230 to make an electrical connection using any suitable die attach method, such as mass reflow, thermo-compression bonding, laser-assist bonding, direct and hybrid bonding, etc. In addition, an underfill material or layer (not shown) may be formed or injected between the individual module 123 and multi-chip package substrate 230.

As illustrated, the multi-chip package substrate 230 is similar to the multi-chip package substrate 12-26 depicted in FIG. 1, so the reference numbering for the constituent components and layers in the multi-chip package substrate 12-26 are not repeated. However, the multi-chip package substrate 230 may include one or more additional thermal conduction paths 231, 232 formed with the first or upper RDL stack in the package substrate 230. For example, a first thermal conduction path may include one or more thermal vias 231 formed with one or more conductive layers that are constructed in the first insulator layer(s) 25 to connect any heat dissipation paths (not shown) in the substrate core 15 to the first or top surface of the multi-chip package substrate 230. In addition or in the alternative, a second thermal conduction path may include a thermal conduction trench and one or more thermally conductive RDL elements 232 constructed in the first insulator layer(s) 25 to connect embedded elements 21-24 to the first or top surface of the multi-chip package substrate 230.

Though not shown, it will be appreciated that additional processing may be applied to attach or mount a heat spreader lid or heat sink cover on the package assembly similar to the embodiment illustrated in FIG. 2*i*. For example, one or more backside metallization (BSM) layers may be formed as patterned thermal interface material layers that are selectively formed or applied on the exposed surface(s) of the chip module(s) 223, 226-227 to make direct, thermal conduction contact with the IC dice or chip modules 211-213, 226. In addition, one or more patterned thermal interface material (TIM) layers may be selectively formed or applied on an exposed surface of each of the module(s) 223, 226-227 using a compliant, thermally conductive grease or non-curing silicon material to minimize the thermal resistance between the modules and the subsequently attached heat spreader lid array, and to protect the IC dice or chip modules 211-213, 226 from compression-related damage. Subsequently, a thermally conductive heat spreader lid may be placed in registry with and attached to directly thermally contact the plurality of IC dice or chip modules 211-213, 226 using the patterned TIM layer and BSM layer as thermally conductive layers.

To illustrate an example sequence of process steps for fabricating an integrated circuit package assembly in accordance with selected substrate-level reconstitution embodiments of the present disclosure, reference is now made to FIGS. 4*a-f* which show cross-sectional views of various manufacturing process steps for attaching a plurality of integrated circuit dice 410-417 and heat sink lid/covers to a plurality of multi-chip package substrates 402-403 having embedded active and/or passive circuit elements. In the process flow for this substrate-level reconstitution embodiment, a plurality of package substrates 402-403 are attached to a first temporary carrier 401, followed by reconstitution of bumped integrated circuit dice 410-417 on the package substrates 402-403 for molding and grinding prior to singulation and attachment of a heat sink lid/cover 432.

Figures 4A, 4B, 4C:
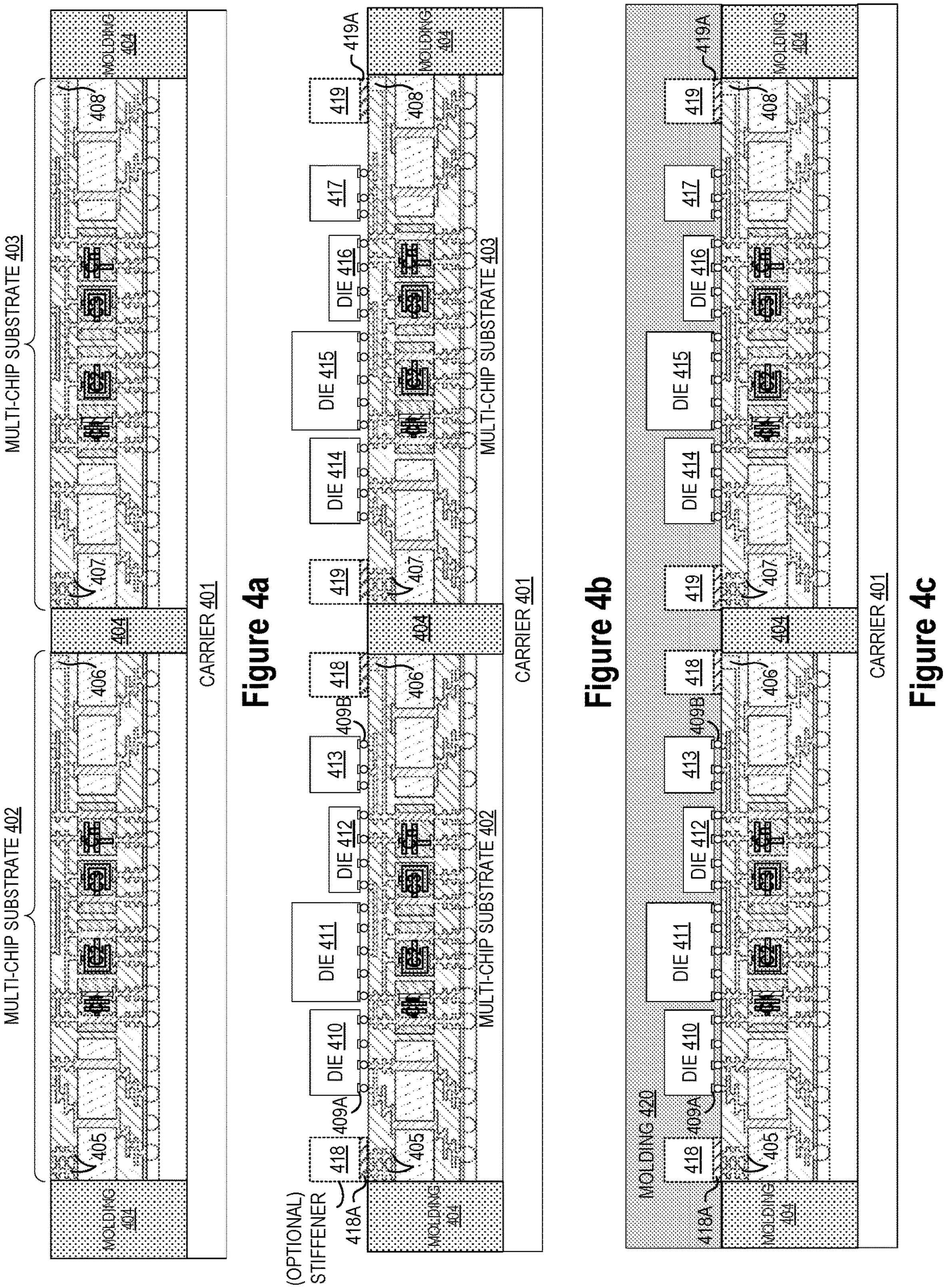
FIGS. 4*a-f* depict cross-sectional views of a sequence of fabrication steps for attaching a plurality of integrated circuit dice and a heat sink lid/covers to a plurality of multi-chip package substrates in accordance with selected substrate-level reconstitution embodiments of the present disclosure.

As depicted in FIG. 4*a*, a first carrier or holder or panel 401, such as a glass substrate, is provided. In addition, a plurality of multi-chip package substrates 402-403 are provided and attached to the first carrier 401 using any suitable attachment technique. As depicted, each multi-chip package substrate 402-403 is attached to the substrate carrier 401 with their first or upper fine pitch RDL stacks exposed on the top sides and with their second or bottom coarse pitch RDL stacks facing the multi-chip package substrates 402, 403. As illustrated, each of the multi-chip package substrates 402, 403 is similar to the multi-chip package substrate 12-26 depicted in FIG. 1, so the reference numbering for the constituent components and layers in the multi-chip package substrate 12-26 are not repeated. However, each of the multi-chip package substrates 402, 403 may include one or more additional thermal conduction paths 405-408 formed with the first or upper RDL stack in the package substrates 402, 403. For example, a first thermal conduction path may include one or more thermal vias 405, 407 formed with one or more conductive layers that are constructed in the first insulator layer(s) 25 to connect any heat dissipation paths (not shown) in the substrate core 15 to the first or top surface of the multi-chip package substrates 402, 403. In addition or in the alternative, a second thermal conduction path may include a thermal conduction trench and one or more thermally conductive RDL elements 406, 408 constructed in the first insulator layer(s) 25 to connect embedded elements 21-24 to the first or top surface of the multi-chip package substrates 402, 403.

After attaching the multi-chip package substrates 402, 403 to the substrate carrier 401, an optional molding compound material 404 may be applied to help secure the multi-chip package substrates 402, 403. In selected embodiments, the step for forming the molding compound material 404 may be omitted or replaced by a subsequent molding compound formation step. The molding compound material 404 can be any appropriate encapsulant having properties that are suitable for providing mechanical support and structural integrity to maintain the physical arrangement of the multi-chip package substrates 402, 403 on the carrier 401, including during the subsequent grinding or etching process (described below). As will be appreciated, the molding compound material 404 may use any suitable molding material (e.g., silica-filled epoxy molding compounds, plastic encapsulation resins, and other polymeric materials such as silicones, polyimides, phenolics, and polyurethanes), and may be applied by a variety of standard processing techniques used in encapsulation including, for example, printing, pressure molding, injection molding, film-assisted molding, and spin application. In selected embodiments, the molding compound material 404 is formed to a height that is at or below the height of the multi-chip package substrates 402, 403, or may be formed to completely cover the multi-chip package substrates 402, 403, followed by etching or grinding to planarize the molding compound material 404 with the multi-chip package substrates 402, 403. Once the molding compound material 404 is applied, the panel can be cured by exposing the materials to certain temperatures for a period of time, or by applying curing agents, or both.

FIG. 4*b* illustrates a cross-sectional view of the panelized multi-chip package substrates 402, 403 after additional processing is applied to attach a plurality of bumped integrated circuit dice 410-417 having different heights to the panelized multi-chip package substrates 402, 403. As depicted, each die 410-417 includes a first or bottom surface having connector terminals or conductive landing pads 409A which are connected to corresponding microbump conductors 409B. Any suitable method may be used to position the integrated circuit dice 410-417 onto the panelized multi-chip package substrates 402, 403, such as using a pick-and-place machine to position the integrated circuit dice 410-417 on the panelized multi-chip package substrates 402, 403. Once the integrated circuit dice 410-417 are aligned and placed to make an electrical connection with the terminal metals of the first or RDL stack in the panelized multi-chip package substrates 402, 403, a die attach method is applied to attach the dice to the package substrates, such as mass reflow, thermo-compression bonding, laser-assist bonding, direct and hybrid bonding, etc. In addition, an underfill material or layer (not shown) may be formed or injected between the integrated circuit dice 410-417 and multi-chip package substrates 402, 403.

Before or after attaching the integrated circuit dice 410-417 to the multi-chip package substrates 402, 403, one or more optional stiffener structures 418, 419 may be formed on each of the multi-chip package substrates 402, 403 to surround or encircle the integrated circuit dice 410-417. The stiffener structures 418, 419 can be formed with any suitable material having structural properties that are suitable for providing mechanical support and structural integrity to reduce any warpage or bending of the multi-chip package substrates 402, 403. In addition, the material properties of the stiffener structures 418, 419 may include thermal conductive properties to enable the stiffener structures 418, 419 to provide a thermal conduction or heat spreading path for heat generated by the integrated circuit dice 410-417 and/or embedded elements in the multi-chip package substrates 402, 403. As depicted, the stiffener structures 418, 419 may be formed to include a thermally conductive adhesive layer 418A, 419A which is used to attach the stiffener structures 418, 419 to one or more thermal conduction paths 405-408 formed in the multi-chip package substrates 402, 403. For example, the thermally conductive adhesive layers 418A, 419A may be a TIM film or tape and applied to the bottom surface of each stiffener structure 418, 419.

In selected embodiments, each stiffener structure (e.g., 418) is formed as a ringed structure that surrounds the integrated circuit dice (e.g., 410-413) formed in a package substrate (e.g., 402). In other selected embodiments where the stiffener structures 418, 419 provide a thermal conduction path for heat generated by the integrated circuit dice 410-417 and/or embedded elements in the multi-chip package substrates 402, 403, the height of each stiffener structure (e.g., 418) is at least as tall as the shortest integrated circuit die (e.g., 412). In other embodiments where the stiffener structures 418, 419 do not provide a thermal conduction path, the height of each stiffener structure (e.g., 418) may be shorter than any of the dice. In other embodiments, the step for forming the stiffener structures 418, 419 may be omitted.

FIG. 4*c* illustrates a cross-sectional view of the panelized multi-chip package substrates 402, 403 after additional processing is applied to encapsulate the IC dice 410-417 (and stiffener structures 418-419) in accordance with selected embodiments of the present disclosure. As depicted, a molding material is applied to completely cover the multi-height IC dice 410-417 affixed to the multi-chip package substrates 402, 403, thereby forming an encapsulant or molding compound body 420 that encapsulates the multi-height IC dice 410-417 within the molding material. The molding material can be any appropriate material (such as a silica-filled epoxy molding compound, plastic encapsulation resin, and other polymeric material) and can be applied by a variety of standard processing techniques used in encapsulation including (such as printing, pressure molding, injection molding, film-assisted molding, and spin application) and then cured by exposing the materials to certain temperatures for a period of time, or by applying curing agents, or both. In the encapsulation process, the depth of the molding compound body 420 should exceed a maximum height of the IC dice 410-417 being embedded, or could be at least the height of the shortest of the IC dice 410-417.

Figures 4D, 4E, 4F:
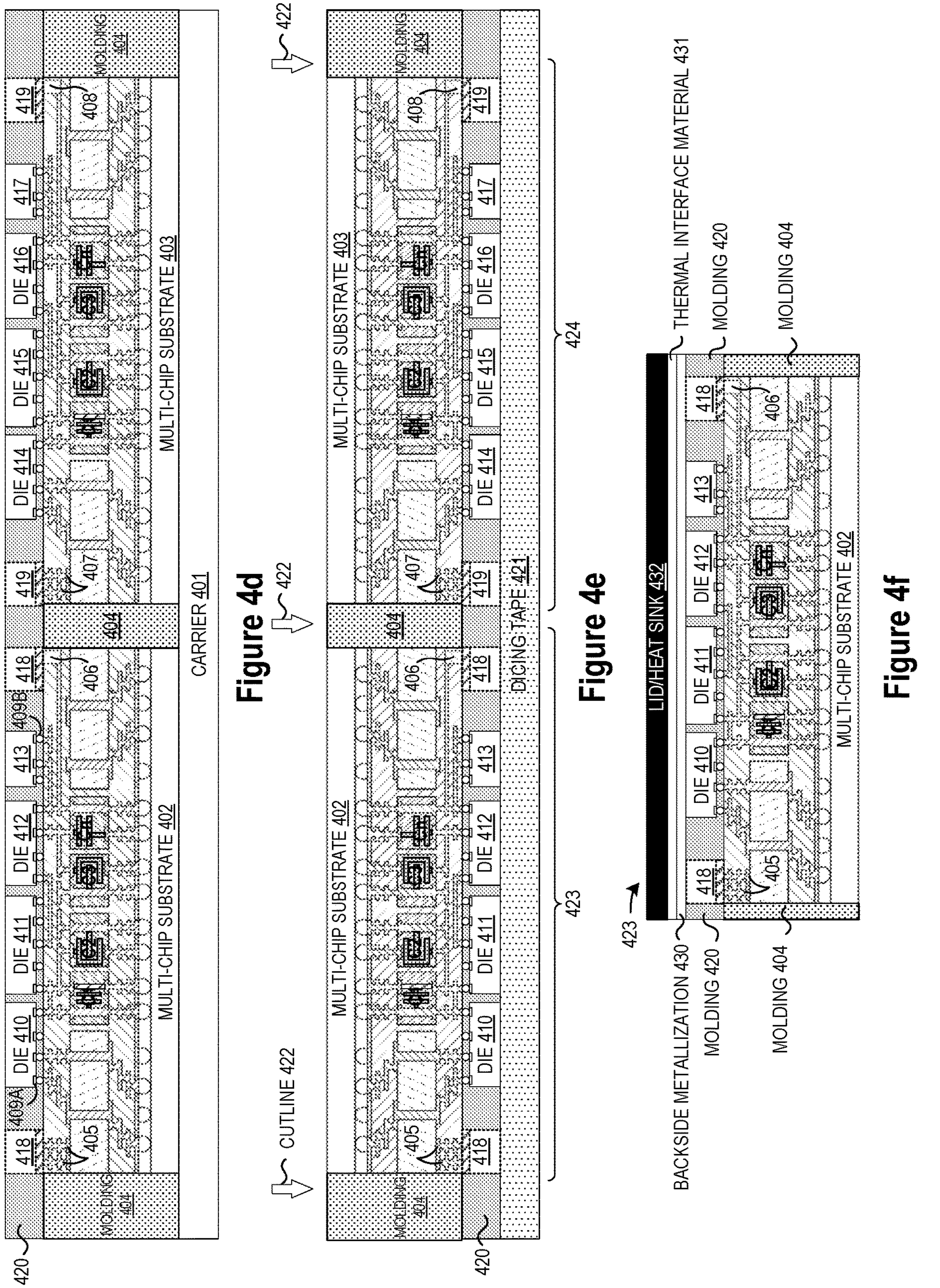

FIG. 4*d* illustrates a cross-sectional view of the encapsulated panel of IC dice 410-417 (and stiffener structures 418-419) after additional processing is applied to grind or etch the encapsulated panel 410-420 to achieve a desired panel thickness to expose the IC dice 410-417 at a flat heat dissipation surface in accordance with selected embodiments of the present disclosure. As disclosed herein, a grinding or etching process may be applied to reduce the thickness of the encapsulant or mold compound body 420 to a desired panel thickness which exposes the shortest of the IC dice 410-417 (if not also the stiffener structures 418-419). Again, the grinding or etching process must be capable of removing not only an upper portion of the molding compound body 420, but also the upper portions of any of the IC dice 410-417 (if not also the stiffener structures 418-419) which are taller than then shortest die so that each of the IC dice 410-417 have the same height. To reduce the thickness of the encapsulant 420 and any etched dice 410-417, any suitable grinding or etching process may be used, such as mechanical grinding, chemical etching, laser ablation, or other suitable techniques (e.g., back grinding), that is carefully controlled to prevent the integrated circuit elements formed at the first or bottom surface of the IC dice 211-219 from being reached, impaired, or damaged. As a result of the grinding process, each of the IC dice 410-417 and the molding compound 420 have the same height, and the mechanical and structural integrity of the IC dice 410-417 and their attachment to the multi-chip package substrates 402, 403 is not disturbed.

FIG. 4*e* illustrates a cross-sectional view of the etched panel of encapsulated IC dice 410-420 after additional processing is applied to singulate the etched panel of encapsulated IC dice 410-420 into individual modules 423, 424 in accordance with selected embodiments of the present disclosure. As a preliminary step, a die-side or top surface of the etched panel of encapsulated IC dice 410-420 is attached or mounted to a dicing tape or adhesive layer 421 that is used to hold the panel during saw operations and to hold the subsequently singulated modules 423-424 formed after saw operations. In addition, the assembly is turned over or flipped or otherwise positioned so that the first carrier 401 can be removed or released. Once released, the side of the etched panel of encapsulated IC dice 411-420 previously attached to the first carrier 401 may be cleaned to remove any adhesive. In addition, one or more cutting or sawing processes 422 are applied to singulate the etched panel of encapsulated IC dice 410-420 into individual modules 423-424, such as by using a saw or laser or other cutting device that is applied along defined saw cut lines 422 or scribe grids (not shown) to cut down through the etched panel of encapsulated IC dice 410-420 and into or through the dicing tape 421.

FIG. 4*f* illustrates an enlarged cross-sectional view of the individual module 423 after additional processing is applied to attach or mount a heat spreader lid or heat sink cover 432 on the package assembly in accordance with selected embodiments of the present disclosure. As a preliminary step, a first or top surface of the multi-chip package substrate 402 may be attached to a second carrier (not shown) so that the individual module 423 may be released from the dicing tape 421 and so that the multi-chip package substrate 402 may be turned over or flipped or otherwise positioned so that the flat heat dissipation surface of the etched or grinded dice 410-413 (a stiffener structure 418) is exposed. On the exposed flat heat dissipation surface of the etched or grinded dice 410-413, one or more backside metallization (BSM) layers 430 may be formed as patterned thermal interface material layers that are selectively formed or applied on the exposed surface(s) of the chip module 423 to make direct, thermal conduction contact with the IC dice or chip modules 410-413 (and any stiffener structures 418). In addition, one or more patterned thermal interface material (TIM) layers 431 may be selectively formed or applied on an exposed surface of each of module 423 and/or BSM layer 430 using a compliant, thermally conductive grease or non-curing silicon material to minimize the thermal resistance between the modules and the subsequently attached heat spreader lid array, and to protect the IC dice or chip modules 410-413 from compression-related damage. Subsequently, a single heat spreader lid 432 is formed with thermally conductive material such as, for example, copper (e.g., CDA194 copper) or other copper alloy, nickel iron alloy (e.g., Alloy 42) or other Ni alloys, and the like. The depicted heat spreader lid 432 is placed in registry with and attached to directly thermally contact the plurality of IC dice or chip modules 410-413 using the patterned TIM layer 431 and BSM layer 430 as thermally conductive layers. In selected embodiments, the heat spreader lid 432 is also attached to directly thermally contact the thermally conductive stiffener structures 418 to enable thermal dissipation from embedded active/passive elements in the multi-chip package substrate 402 through the head spreader lid as a heat sink. In other embodiments, the heat spreader lid 432 may be formed to include a thermally conductive adhesive layer which is used to attach the heat spreader lid 432 to one or more thermal conduction paths formed in the multi-chip package substrate 402.

As disclosed herein, a plurality of multi-height integrated circuit dice are reconstituted or attached to a multi-chip package substrate using any suitable die attach mechanism, either before or after encapsulating and planarizing the multi-height integrated circuit dice in a molding compound structure which exposes a flat heat dissipation surface of the etched or grinded integrated circuit dice. In embodiments where the planarized integrated circuit dice are surrounded with a stiffener ring structure and encapsulated with a molding compound, the resulting module(s) of encapsulated dice should have sufficient structural integrity to maintain a substantially flat or planar positioning relative to one another. As a result, the assembly interface connectors (e.g., microbump conductors, solder, Cu joint, etc.) formed on the active surfaces of the planarized integrated circuit dice are also substantially flat or planar in their relative positioning. However, certain types of device packaging structures, such as multi-chip package substrates, can be warped due to differing stress performance of the materials used to form the device packaging structures. The resulting warpage can prevent assembly interface connectors on the encapsulated dice module from forming a solid electro-physical connection with the terminal metals of the RDL stack in the multi-chip package substrate.

To address the challenge of connecting dice to a warped package substrate, selected embodiments of the present disclosure provide a method and apparatus for addressing package substrate warpage by selectively extending the substrate landing pad heights in localized areas of a warped substrate to effectively planarize the substrate landing pads, thereby mitigating the non-contact between the assembly interface connectors and the substrate landing pads caused by substrate warpage during assembly. For an improved understanding of selected embodiments of the present disclosure, reference is now made to FIG. 5 which depicts a cross-sectional view of a fabrication process for applying local edge solder layers 503 to extend the heights of landing pad heights 502 in localized edge areas of a warped multi-chip substrate 501 so that an encapsulated panel of integrated circuit dice 510 can be attached to the warped multi-chip package substrate 501. As depicted, the encapsulated panel of integrated circuit dice 510 includes a plurality of integrated circuit die 511-513 that are encapsulated in a planarized molding compound 514, though it will be appreciated that the substrate landing pad extension technique disclosed herein may also be used with the attachment of separate integrated circuit die 511-513 that are not encapsulated in molding compound. Each of the integrated circuit dice 511-513 includes an active or lower surface where a plurality of landing pads 515 and attached first level interconnect conductors 516 (e.g., bumps) are formed in a linear or planar position with respect to one another. In addition, the multi-chip package substrate 501 includes a plurality of substrate landing pads 502 formed on a first or upper surface. In selected embodiments, the multi-chip package substrate 501 may be similar to the multi-chip package substrates depicted in FIGS. 1-4 to include an upper fine pitch RDL stack facing the IC dice 511-513 and a bottom coarse pitch RDL stack facing away from the IC dice 511-513. However, due to processing effects that occur during elevated assembly temperatures, there is a positive warpage of the multi-chip package substrate 501 relative to the encapsulated panel of integrated circuit dice 510 which causes certain edge locations of the first level interconnect conductors 516 to be at a different or larger z-height relative to the corresponding substrate landing pads 502. As a result there are non-contacts or gaps between the first level interconnect conductors 516 (e.g., bumps) and the substrate landing pads 502 on at least the peripheral edges of the multi-chip package substrate 501. The non-contact or gap effect can be further pronounced with first level interconnect conductors 516 which implement finer bump pitches since smaller amounts of solder volume are used.

By selective adding edge solder layers 503 (or similar conductive contact materials) to selected substrate landing pads 502 located on peripheral edges of the warped multi-chip substrate 501, different substrate landing pad heights are effectively produced at the edges of the warped substrate. As will be appreciated, the thickness of the edge solder layers 503 may be selectively varied across the surface of the warped substate to account for warpage-induced gaps between the first level interconnect conductors 516 (e.g., bumps) at the substrate landing pads 502. In this way, the "taller" substrate landing pads (formed with the substrate landing pads 502 and the edge solder layers 503) at the edges are positioned to make contact with the attached first level interconnect conductors 516 (e.g., bumps) at the edges, while the "shorter" substrate landing pads (formed only with the substrate landing pads 502) are also positioned to make contact with the attached first level interconnect conductors 516 (e.g., bumps) at the center. In effect, a "taller" edge substrate landing pads 502/503 compensate for the positive warpage in the substrate 501.

Figure 6:
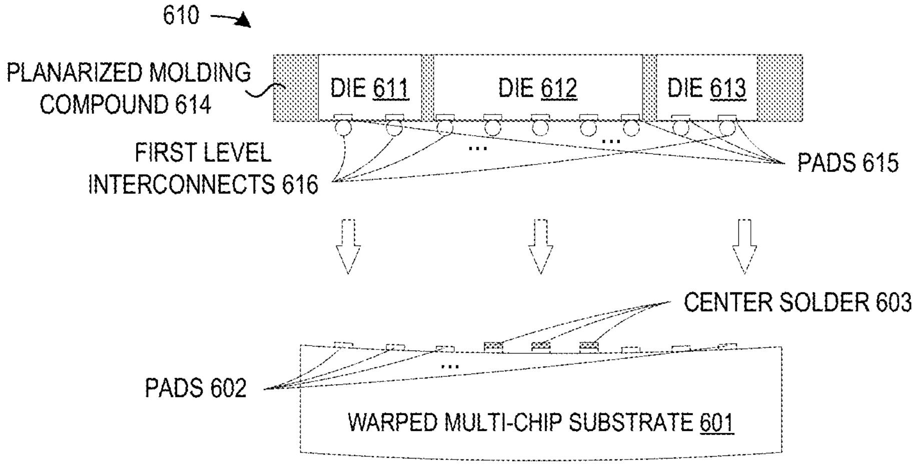
FIG. 6 depicts a cross-sectional view of a fabrication process for applying local center solder layers to attach an integrated circuit die to a warped multi-chip package substrate in accordance with selected embodiments of the present disclosure.

As will be appreciated, the device packaging structures may have other warpage effects that can prevent assembly interface connectors on the encapsulated dice module from forming a solid electro-physical connection with the terminal metals of the RDL stack in the multi-chip package substrate. For example, reference is now made to FIG. 6 which depicts a cross-sectional view of a fabrication process for applying local center solder layers 603 to extend the heights of substrate landing pad heights 602 in localized central areas of a warped multi-chip substrate 601 so that an encapsulated panel of integrated circuit dice 610 can be attached to the warped multi-chip package substrate 601 in accordance with of selected embodiments of the present disclosure. As depicted in FIG. 6, the encapsulated panel of integrated circuit dice 610 includes a plurality of integrated circuit die 611-613 that are encapsulated in a planarized molding compound 614. Each of the integrated circuit dice 611-613 includes an active or lower surface where a plurality of landing pads 615 and attached first level interconnect conductors 616 (e.g., bumps) are formed in a linear or planar position with respect to one another. In addition, the multi-chip package substrate 601 includes a plurality of substrate landing pads 602 formed on a first or upper surface. In selected embodiments, the multi-chip package substrate 601 may be similar to the multi-chip package substrates depicted in FIGS. 1-4 to include an upper fine pitch RDL stack facing the IC dice 611-613 and a bottom coarse pitch RDL stack facing away from the IC dice 611-613. However, due to processing effects that occur during elevated assembly temperatures, there is negative warpage of the multi-chip package substrate 601 relative to the encapsulated panel of integrated circuit dice 610 which causes certain central locations of the first level interconnect conductors 616 to be at a different are larger z-height relative to the corresponding substrate landing pads 602. As a result there are non-contacts or gaps between the first level interconnect conductors 616 (e.g., bumps) and the substrate landing pads 602 on at least the central regions of the multi-chip package substrate 601. The non-contact or gap effect can be further pronounced with first level interconnect conductors 616 which implement finer bump pitches since smaller amounts of solder volume are used.

By selective adding edge solder layers 603 (or similar conductive contact materials) to selected substrate landing pads 602 located on central area of the warped multi-chip substrate 601, different substrate landing pad heights are effectively produced at the center of the warped substrate. As will be appreciated, the thickness of the center solder layers 603 may be selectively varied across the surface of the warped sub state to account for warpage-induced gaps between the first level interconnect conductors 616 (e.g., bumps) at the substrate landing pads 602. In this way, the "taller" substrate landing pads (formed with the substrate landing pads 602 and the edge solder layers 603) at the center are positioned to make contact with the attached first level interconnect conductors 616 (e.g., bumps) at the edges, while the "shorter" substrate landing pads (formed only with the substrate landing pads 602) are also positioned to make contact with the attached first level interconnect conductors 616 (e.g., bumps) at the peripheral edges. In effect, a "taller" center substrate landing pads 602/603 compensate for the negative warpage in the substrate 601.

Figure 5:
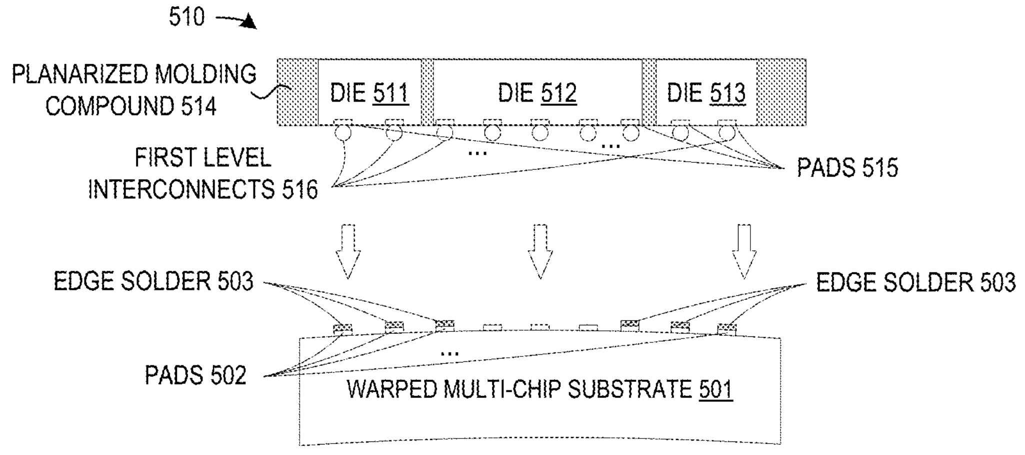
FIG. 5 depicts a cross-sectional view of a fabrication process for applying local edge solder layers to attach an integrated circuit die to a warped multi-chip package substrate in accordance with selected embodiments of the present disclosure.

As disclosed herein with respect to FIGS. 5-6, the additional edge or central solder layers 503, 603 may be positioned in alignment with the "shadow" of the embedded active/passive components in the multi-chip substrate 501, 601 which can contribute to the warpage. For example, the additional solder layers may be positioned outside of the shadow of the embedded active/passive components in the multi-chip substrate 501, 601. Alternatively, the additional solder layers may be positioned inside the shadow of the embedded active/passive components in the multi-chip substrate 501, 601. In this way, the additional solder layers provide warpage correction that is directly correlated to the underlying cavity in the multi-chip substrate where the embedded active/passive components are formed.

As disclosed herein, the challenge of connecting IC dice to a warped package substrate can also be addressed by providing a method and apparatus wherein a magnetic stiffener ring is formed on the warped package substrate and then applying magnetic field which interacts with the magnetic stiffener ring to clamp the warped package substrate into a straighten or non-warped shape, thereby mitigating the non-contact between assembly interface connectors on the IC dice and the substrate landing pads caused by substrate warpage during assembly. For example, reference is now made to FIGS. 7*a-b* which depicts a cross-sectional view of a fabrication process for using one or more magnetic stiffener rings 710, 715 formed on a warped multi-chip package substrate 703 and applying a magnetic force 702 created by a magnetic chuck table 701 to clamp or straighten the warped multi-chip package substrate 703, either before or after attaching a plurality of integrated circuit dice 711-714 to the multi-chip package substrate 703.

Figure 7A:
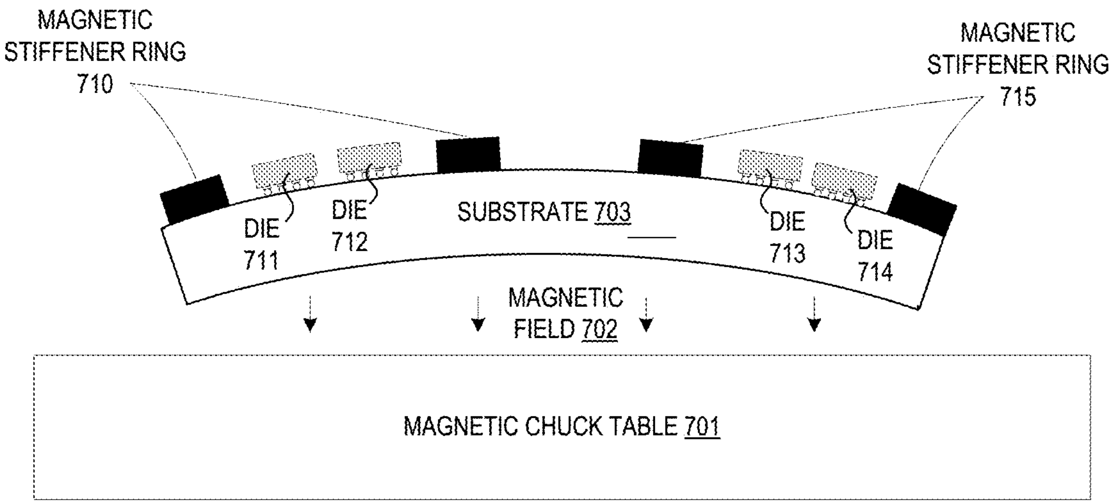
FIGS. 7*a-b* depict a cross-sectional view of a fabrication process for using one or more magnetic stiffener rings and a magnetic chuck table to exert a magnetic force which clamps or straightens a warped multi-chip package substrate in accordance with selected embodiments of the present disclosure.

As depicted in FIG. 7*a*, one or more magnetic stiffener rings 710, 715 are formed on the warped multi-chip package substrate 703 and positioned to surround the intended placement location for a plurality of integrated circuit die 711-714 which may also be attached to the warped multi-chip package substrate 703, either before or after attaching the magnetic stiffener rings 710, 715 to the substrate 703. In selected embodiments and as indicated with the dashed lines, the plurality of integrated circuit dice 711-714 may be attached after dewarping the multi-chip package substrate 703 and then held in place with an underfill layer and/or with an encapsulating molding compound. As depicted, each of the integrated circuit dice 711-714 has an active or lower surface that is attached to the warped multi-chip package substrate 703 using a plurality of landing pads and attached first level interconnect conductors (e.g., microbumps) which are positioned for alignment and attachment to the multi-chip package substrate 703. In addition, the multi-chip package substrate 703 includes a plurality of substrate landing pads formed on a first or upper surface. In selected embodiments, the multi-chip package substrate 703 may be similar to the multi-chip package substrates depicted in FIGS. 1-4 to include an upper fine pitch RDL stack facing the IC dice 711-714 and a bottom coarse pitch RDL stack facing away from the IC dice 711-714. While the multi-chip package substrate 703 is depicted as having a positive warpage, it will be appreciated that other warpage profiles can be caused by processing effects during assembly.

In selected embodiments, the magnetic stiffener rings 710, 715 are attached to the substrate 703 and positioned to leave a space where the IC die 711-714 will subsequently be placed on the substrate 703 (e.g., after clamping or straightening of the substrate). In other embodiments, the magnetic stiffener rings 710, 715 are attached to the substrate 703 at the same time or after attaching the IC die 711-714 to the substrate 703. In any case, the magnetic stiffener rings 710, 715 are formed with a suitable magnetic material having ferromagnetic, ferrimagnetic, or paramagnetic properties which will respond to a magnetic field 702 to exert a physical clamping force on the warped package substrate 703 to clamp the warped package substrate 703 into a straighten or non-warped shape. As a result there are non-contacts or gaps between the first level interconnect conductors 616 (e.g., bumps) and the substrate landing pads 602 on at least the central regions of the multi-chip package substrate 601. The non-contact or gap effect can be further pronounced with first level interconnect conductors 616 which implement finer bump pitches since smaller amounts of solder volume are used.

Figure 7B:
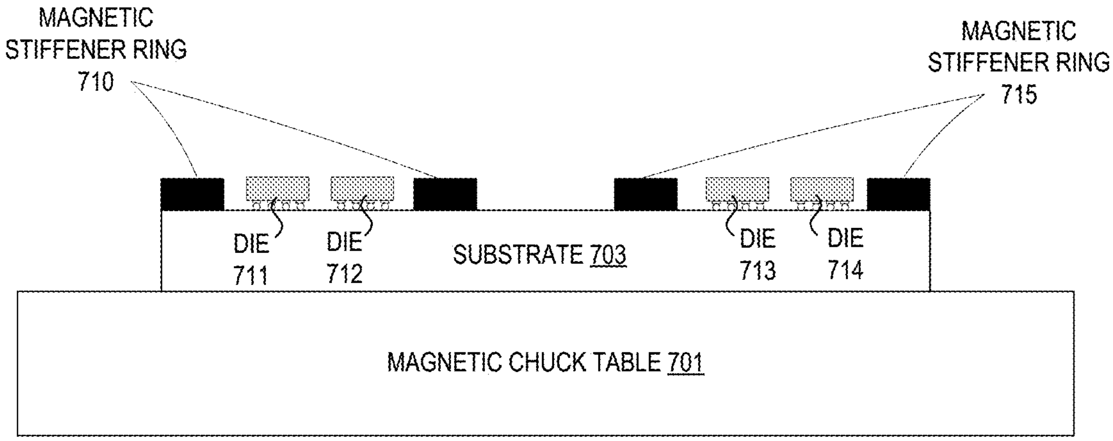

Referring now to FIG. 7*b*, the clamping effect of the magnetic stiffener rings 710, 715 to straighten the substrate 703 is shown. As will be appreciated, the magnetic stiffener rings 710, 715 can be temporarily or permanently magnetized using any suitable technique. For example, the magnetic chuck table 701 can create the magnetic field 702 either with or without vacuum conditions. However, it will be appreciated that any suitable technique may be used during assembly to introduce or generate the clamping magnetic field 702 which interacts with the magnetic stiffener rings 710, 715 to straighten the substrate 703 as shown. For example, by magnetizing the magnetic stiffener rings 710, 715 to straighten the substrate 703 prior to attaching the IC dice 711-714, any non-contact or gap between the IC dice 711-714 and the substrate 703 can reduced or eliminated. In addition, the use of magnetic stiffener rings 710, 715 to straighten the substrate 703 before attaching the IC dice 711-714 enables an assembly sequence for attaching, encapsulating and grinding or etching a plurality of multi-height integrated circuit dice to form the IC dice 711-714 in a molding compound (not shown) which exposes a flat heat dissipation surface on the IC dice 711-714 for thermal connection to a heat sink lid/cover (not shown). Another benefit from using magnetic stiffener rings 710, 715 to straighten the substrate 703 prior to die attachment is that the magnetic stiffener rings 710, 715 limit or restrict or reduce the planar (or lateral or x-y) expansion of the package substrate during the die attachment process.

Figure 8:
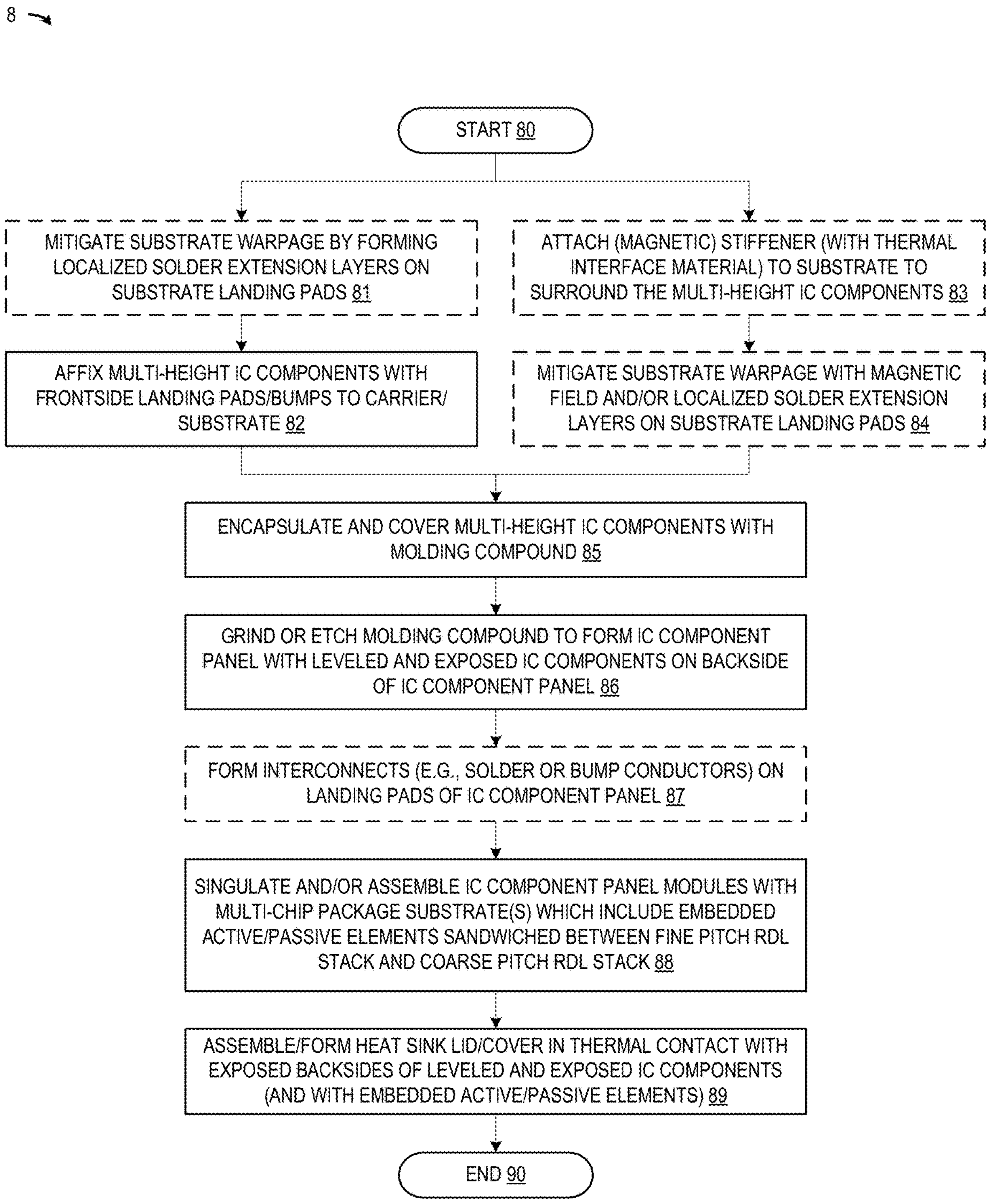
FIG. 8 illustrates a simplified flow chart showing a method for fabricating a package assembly wherein a plurality of integrated circuit dice and a heat sink lid/cover are attached to a multi-chip package substrate with embedded active/passive components in accordance with selected embodiments of the present disclosure.

Turning now to FIG. 8, there is illustrated a simplified flow chart 8 showing an example sequence of steps 81-90 for fabricating a package assembly wherein a plurality of integrated circuit dice and a heat sink lid/cover are attached to a multi-chip package substrate with embedded active/passive components in accordance with selected embodiments of the present disclosure. After the process begins (at step 80), a plurality of multi-height integrated circuit components are affixed or placed on a carrier or a package substrate (step 82), such as by using a pick-and-place-machine to place a plurality of integrated circuit dice (e.g., active or passive circuit components) onto a glass substrate using an adhesive layer or other die attach mechanism. At the attachment face with the carrier, the multi-height integrated circuit components may each include at least one contact terminal and/or first level interconnect conductor (e.g., microbump) for making electrical connection to the integrated circuit component. In selected embodiments, the carrier may be a glass substrate, while in other embodiments, the carrier may be a multi-chip package substrate having embedded active/passive elements which are electrically and/or thermally connected through conductive elements of a first or upper fine pitch RDL stack formed on the multi-chip package substrate. As indicated with the dashed lines at step 81, an optional preliminary step may be performed prior to affixing the multi-height integrated circuit components to a package substrate to mitigate any warpage on the package substrate by forming localized solder extension layers on the substrate landing pads to close any gap between the integrated circuit components and package substrate. However, it will be appreciated that the warpage mitigation step 81 may be omitted from the fabrication process.

At step 83, a stiffener ring or other structure may optionally be attached to the carrier to surround the multi-height integrated circuit components. In selected embodiments, the stiffener element(s) may be attached to the carrier substrate by using a thermally conductive adhesive material, such as a patterned thermal interface material (TIM) layer formed on the carrier. In other embodiments, the stiffener element(s) may be formed with a thermal interface material. In other embodiments, the stiffener element(s) may be formed with a magnetic material having ferromagnetic, ferrimagnetic, or paramagnetic properties which will respond to a magnetic field. The height of the stiffener elements may be shorter than the shortest integrated circuit component and still provide mechanical stiffening benefits, but may also be taller than the shortest integrated circuit components in embodiments where the stiffener component will be used to provide a thermal conduction path to a subsequently-formed heat sink lid/cover. As indicated by the dashed lines, the stiffener attachment step 83 is an optional step that may be omitted from the fabrication sequence. Alternatively, the stiffener attachment step 83 may occur simultaneously with or even before the dice attachment step 82.

At step 84, an optional warpage mitigation step may be performed to mitigate any warpage on the package substrate. In selected embodiments, the warpage mitigation step may include applying a magnetic field which interacts with a magnetic stiffener ring or structure to clamp or straighten out warpage in the carrier. In addition or in the alternative, the warpage mitigation step may include forming localized solder extension layers on the substrate landing pads of the substrate to close any gap between the integrated circuit components and package substrate. As indicated by the dashed lines, the warpage mitigation step 84 is an optional step that may be omitted from the fabrication sequence.

At step 85, the multi-height integrated circuit components (and any stiffener elements) are encapsulated and covered with a molding compound. By covering or encapsulating integrated circuit components with a suitable encapsulant material, such as an epoxy molding compound which is cured to form a mold compound body that covers the circuit components, an encapsulated integrated circuit component panel is formed wherein each of the multi-height integrated circuit components extend upward by a different height from the carrier.

At step 86, a grinding or etching or laser ablation process is applied to the molding compound to form an integrated circuit component panel with leveled and exposed IC components on the backside of the integrated circuit component panel s at a flat heat dissipation surface, thereby forming a thinned encapsulated integrated circuit component panel. For example, by back-grinding the top of the molding compound to thin the encapsulated integrated circuit component panel to a desired thickness that is at least as tall as the shortest integrated circuit component, the multi-height integrated circuit components (and any stiffener elements) are etched or grinded to a uniform height and are exposed at the top of the etched molding compound.

At step 87, interconnect conductor elements (e.g., microbump) may optionally be formed on the contact terminal(s) (e.g., landing pads) of the leveled integrated circuit components. In order to form the interconnect conductor elements, the thinned encapsulated integrated circuit component panel is removed from the carrier, cleaned, flipped, and mounted to a second carrier, such as a process carrier or other suitable substrate, using any desired attachment or adhesive mechanism. In selected embodiments, the interconnect conductor elements may be built on the active surfaces of the thinned encapsulated integrated circuit component panel to make electrical contact with exposed contact terminals of the integrated circuit components, such as by sequentially depositing, patterning, etching insulating layers and conductive layers (e.g., plated copper) to form fine pitched plated conductor lines. As indicated by the dashed lines, the interconnect formation step 87 is an optional step that may be omitted from the fabrication sequence when the multi-height integrated circuit components already include first level interconnect conductors (e.g., microbumps).

At step 88, the thinned encapsulated integrated circuit component panel may be singulated into individual IC component panel modules which are assembled or attached to one or more multi-chip package substrates which each include embedded active and/or passive elements which are sandwiched between a fine pitch RDL stack and coarse pitch RDL stack. In selected embodiments, the thinned encapsulated integrated circuit component panel is singulated using a saw, laser, or other cutting process which separates the thinned encapsulated integrated circuit component panel into a plurality of individual IC component panel modules, each having a plurality of IC components exposed in the molding compound by a flat heat dissipation surface. In selected embodiments, the singulation process forms IC component panel modules which are then attached to corresponding multi-chip package substrates. In other embodiments, the singulation process forms an IC component panel modules attached to corresponding multi-chip package substrates.

At step 89, a heat sink or spreader lid/cover is assembled or formed in thermal contact with the exposed backsides of the thinned integrated circuit components, thereby forming a package assembly which includes the multi-chip package substrate, individual IC component panels or modules, and attached heat sink or spreader lid/cover. In selected embodiments, the formation or assembly of the heat sink or spreader lid/cover includes placing the heat sink or spreader lid/cover in registry with and attached to directly thermally contact the plurality of IC components at the flat heat dissipation surface, either directly or through one or more thermally conductive TIM and/or BSM layers. In addition, the heat sink or spreader lid/cover may be attached with thermally conductive stiffener structures to enable thermal dissipation from embedded active/passive elements in the multi-chip package substrate(s). At this point, the package assembly may be placed in a tray and sent for inspection, testing, and laser marking. The process ends at step 90.

By now it should be appreciated that there is provided herein a method and apparatus for making a package assembly. In the disclosed methodology, a first plurality of surface-attachable devices is attached to a temporary carrier, where the first plurality of surface-attachable devices have different heights and interconnect surfaces facing the temporary carrier. In selected embodiments, the plurality of surface-attachable devices includes devices from a group consisting of integrated circuit devices, active devices, passive devices, and/or photonics components. In selected embodiments, the surface-attachable devices are attached to the temporary carrier by attaching a plurality of integrated circuit dice have different heights to the temporary carrier, where each integrated circuit die includes an interconnect surface with landing pad connections. In other embodiments, each integrated circuit die includes an assembly interface of microbump conductors connected, respectively, to the landing pad connections. The disclosed methodology also includes encapsulating the first plurality of surface-attachable devices with a molding compound material that completely covers the first plurality of surface-attachable devices. In addition, the disclosed methodology may include curing the molding compound material to form a first panel of surface-attachable devices having different heights. The disclosed methodology also includes grinding or etching a backside surface of the first panel of surface-attachable devices to thin at least one of the first plurality of surface-attachable devices, thereby forming a thinned panel of surface-attachable devices which have a uniform height. In addition, the disclosed methodology includes singulating the thinned panel of surface-attachable devices into a plurality of integrated circuit packages so that each integrated circuit package includes an encapsulated plurality of surface-attachable devices which have the uniform height, has a planar frontside surface exposing circuit connections on interconnect surfaces of the encapsulated plurality of surface-attachable devices, and has a planar heat dissipation surface exposing backsides of the encapsulated plurality of surface-attachable devices. The disclosed methodology also includes attaching the planar frontside surface of each integrated circuit package to a multichip package substrate to make electric connection between (1) the circuit connections on the interconnect surfaces of the encapsulated plurality of surface-attachable devices and (2) conducting elements in a first redistribution line stack formed on the multichip package substrate which includes a plurality of embedded active and/or passive circuit components sandwiched between the first redistribution line stack and a second redistribution line stack. In addition, the disclosed methodology attaches a heat spreader lid to the planar heat dissipation surface of each integrated circuit package so that the heat spreader lid is thermally connected to dissipate heat from the encapsulated plurality of surface-attachable devices through the planar heat dissipation surface. In selected embodiments, the heat spreader lid is attached to make a thermal conduction path to the embedded active and/or passive circuit components in the multichip package substrate over thermal conducting elements in the first redistribution line stack formed on the multichip package substrate. In selected embodiments, the disclosed methodology may also include forming one or more thermally conductive interface layers on the planar heat dissipation surface of each integrated circuit package before attaching the heat spreader lid to the planar heat dissipation surface of each integrated circuit package. In such embodiments, the thermally conductive interface layer (s) may be formed by first forming a first backside metallization layer on the planar heat dissipation surface of each integrated circuit package, and then forming a thermal interface layer on the backside metallization layer of each integrated circuit package. In selected embodiments, the disclosed methodology may also include forming one or more thermally conductive adhesive layers on the multichip package substrate or heat spreader lid to attach the heat spreader lid to the multichip package substrate and to provide a heat dissipation path to the embedded active and/or passive circuit components in the multichip package substrate over thermal conducting elements in the first redistribution line stack formed on the multichip package substrate.

In another form, there is provided a method and apparatus for making a package assembly. In the disclosed methodology, a first plurality of multichip package substrates is attached to a carrier, where each multichip package substrate includes a plurality of embedded active and/or passive circuit components sandwiched between a first redistribution line stack and a second redistribution line stack. The disclosed methodology also includes attaching, to each multichip package substrate, a first plurality of surface-attachable devices which have different heights and interconnect surfaces facing a corresponding multichip package substrate. In selected embodiments, the plurality of surface-attachable devices includes devices from a group consisting of integrated circuit devices, active devices, passive devices, and/or photonics components. In addition, the disclosed methodology includes encapsulating the first plurality of surface-attachable devices at each multichip package substrate with a molding compound material that completely covers the first plurality of surface-attachable devices without covering the interconnect surfaces, and then curing the molding compound material to form a first panel of surface-attachable devices having different heights which is attached to the first plurality of multichip package substrates. The disclosed methodology also includes grinding or etching a backside surface of the first panel of surface-attachable devices to thin at least one of the first plurality of surface-attachable devices, thereby forming a thinned panel of surface-attachable devices having a uniform height which is attached to the first plurality of multichip package substrates. In addition, the disclosed methodology includes singulating the thinned panel of surface-attachable devices and attached first plurality of multichip package substrates into a plurality of integrated circuit packages, where each integrated circuit package includes an encapsulated plurality of surface-attachable devices having the uniform height which are attached to a corresponding multichip package substrate, and where each integrated circuit package has a planar heat dissipation surface exposing backsides of the encapsulated plurality of surface-attachable devices. The disclosed methodology also includes attaching a heat spreader lid to the planar heat dissipation surface of each integrated circuit package so that the heat spreader lid is thermally connected to dissipate heat from the encapsulated plurality of surface-attachable devices through the planar heat dissipation surface. In selected embodiments, the disclosed methodology also includes forming one or more thermally conductive interface layers on the planar heat dissipation surface of each integrated circuit package before attaching the heat spreader lid to the planar heat dissipation surface of each integrated circuit package. In selected embodiments, the disclosed methodology also includes attaching, to each multichip package substrate, a stiffener ring surrounding first plurality of surface-attachable devices which is subsequently encapsulated by the molding compound material to be included in each integrated circuit package. In such embodiments, the heat spreader lid is attached to make a thermal conduction path through the stiffener ring to the embedded active and/or passive circuit components in the multichip package substrate over thermal conducting elements in the first redistribution line stack formed on the multichip package substrate. In addition, one or more thermally conductive adhesive layers may be formed on the multichip package substrate or the stiffener ring to attach the heat spreader lid to the multichip package substrate and to provide a heat dissipation path to the embedded active and/or passive circuit components in the multichip package substrate over thermal conducting elements in the first redistribution line stack formed on the multichip package substrate. In selected embodiments, the stiffener ring is formed with a magnetic material which will respond to a magnetic field to exert a physical clamping force on the multichip package substrate. In other embodiments, the first plurality of surface-attachable devices are attached to each multichip package substrate by applying localized landing pad conductive material extension layers (such as solder, conductive paste, metal, metal alloy, thermal paste, thermal pad, etc.) to selected conductive landing pads in the first redistribution line stack where warpage of the multichip package substrate has created a gap between the selected conductive landing and circuit connections on the interconnect surfaces of the encapsulated plurality of surface-attachable devices. In selected embodiments, the localized landing pad conductive material extension layers are formed with one or more layers of solder, copper paste, silver paste, and/or copper, and are formed to a thickness to compensate for the warpage where an interconnect surface area is further away from the multichip package substrate. In selected embodiments, the localized landing pad conductive material extension layers are localized to compensate for the warpage where the active surface area is further away from the substrate. Further, the height of the added localized landing pad conductive material extension layers can also vary according to the warpage.

In yet another form, there is provided an integrated circuit package assembly and method for making same. As disclosed, the integrated circuit package assembly includes an encapsulated plurality of integrated circuit dice which is attached to a multichip package substrate having embedded active and/or passive circuit devices. The encapsulated plurality of integrated circuit dice is also attached to a heat spreader lid that is formed on and thermally connected to the encapsulated plurality of integrated circuit dice. As formed, the heat spreader lid includes one or more thermal conductive layers to remove heat from the encapsulated plurality of integrated circuit dice. In addition, the encapsulated plurality of integrated circuit dice are surrounded by a molding compound on all side surfaces but not a top surface facing away from the multi-chip package substrate that provides a planar heat dissipation surface that is directly thermally connected to the heat spreader lid to dissipate heat from the encapsulated plurality of integrated circuit dice through the planar heat dissipation surface. In selected embodiments, the heat spreader lid is thermally connected to the embedded active and/or passive circuit devices with one or more thermal conductive layers to remove heat from the embedded active and/or passive circuit devices.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross-sectional drawings and flow charts illustrating process and structural details of a package assembly and associated fabrication process without including every device feature or aspect in order to avoid limiting or obscuring the present invention. Such descriptions and representations are used by those skilled in the art to describe and convey the substance of their work to others skilled in the art, and the omitted details which are well known are not considered necessary to teach one skilled in the art of how to make or use the present invention. In addition, certain elements in the figures are illustrated for simplicity and clarity and have not necessarily been drawn to scale. It is also noted that, throughout this detailed description, certain layers of materials will be deposited, removed and otherwise processed to form the depicted integrated circuit die and associated packaging structures. Where the specific procedures for forming such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention.

Although the described exemplary embodiments disclosed herein are directed to various packaging assemblies and methods for making same, the present invention is not necessarily limited to the example embodiments which illustrate inventive aspects of the present invention that are applicable to a wide variety of packaging processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the multi-chip package substrates are described with reference to embedded passive components, such as capacitors, resistors, inductors, diodes, and other passive devices, but active devices may also be included as embedded components when forming the multi-chip package substrates, so these are merely exemplary circuits presented to provide a useful reference in discussing various aspects of the invention, and is not intended to be limiting so that persons of skill in the art will understand that the principles taught herein apply to other types of devices. In addition, the process steps may be performed in an alternative order than what is presented. Also, the figures do not show all the details of connections between various elements of the package, since it will be appreciated the leads, vias, bonds, circuit traces, and other connection means can be used to effect any electrical connection. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. In addition, the term "coupled," as used herein, is not intended to be limited to a direct coupling or a mechanical coupling. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making a package assembly, comprising:

attaching a first plurality of surface-attachable devices to a temporary carrier, where the first plurality of surface-attachable devices have different heights and first interconnect surfaces facing the temporary carrier;

encapsulating the first plurality of surface-attachable devices with a molding compound material that completely covers the first plurality of surface-attachable devices;

curing the molding compound material to form a first panel of surface-attachable devices having different heights;

grinding or etching a backside surface of the first panel of surface-attachable devices to thin at least one of the first plurality of surface-attachable devices, thereby forming a thinned panel of surface-attachable devices which have a uniform height;

removing the temporary carrier from the thinned panel of surface-attachable devices before singulating the thinned panel of surface-attachable devices into a plurality of integrated circuit packages, each comprising an encapsulated plurality of surface-attachable devices which have the uniform height, where each integrated circuit package has a planar frontside surface exposing circuit connections on second interconnect surfaces of the encapsulated plurality of surface-attachable devices, and where each integrated circuit package has a planar heat dissipation surface exposing backsides of the encapsulated plurality of surface-attachable devices;

providing a multichip package substrate comprising a plurality of embedded active and/or passive circuit components embedded in one or more cavities of a substrate core sandwiched between a first redistribution line stack and a second redistribution line stack, wherein the first redistribution line stack includes conducting elements, wherein the plurality of embedded active and/or passive circuit components comprises circuit components selected from a group consisting of an integrated circuit capacitor or an integrated circuit die for implementing a specified power, RF, digital and/or photonic functionality, and wherein the plurality of embedded active and/or passive circuit components is positioned for alignment with a first surface-attachable device from the first plurality of surface-attachable devices to have a shadow within which at least one of the embedded active and/or passive circuit components is located;

attaching the planar frontside surface of each integrated circuit package to the first redistribution line stack to make electric connection between the circuit connections and the conducting elements; and attaching a heat spreader lid to the planar heat dissipation surface of each integrated circuit package so that the heat spreader lid is thermally connected to dissipate heat from the encapsulated plurality of surface-attachable devices through the planar heat dissipation surface.

2. The method of claim 1, where attaching the heat spreader lid comprises attaching the heat spreader lid to make a thermal conduction path to the plurality of embedded active and/or passive circuit components in the multichip package substrate over thermal conducting elements in the first redistribution line stack formed on the multichip package substrate.

3. The method of claim 1, where attaching the plurality of surface-attachable devices to the temporary carrier comprises attaching a plurality of integrated circuit dice have different heights to the temporary carrier, where a landing pad is formed at each of the first interconnect surfaces.

4. The method of claim 1, further comprising forming one or more thermally conductive interface layers on the planar heat dissipation surface of each integrated circuit package before attaching the heat spreader lid to the planar heat dissipation surface of each integrated circuit package.

5. The method of claim 4, where forming one or more thermally conductive interface layers comprises:

forming a first backside metallization layer on the planar heat dissipation surface of each integrated circuit package; and forming a thermal interface layer on the backside metallization layer of each integrated circuit package.

6. The method of claim 1, further comprising forming one or more thermally conductive adhesive layers on the multichip package substrate or heat spreader lid to attach the heat spreader lid to the multichip package substrate and to provide a heat dissipation path to the plurality of embedded active and/or passive circuit components in the multichip package substrate over thermal conducting elements in the first redistribution line stack formed on the multichip package substrate.

7. The method of claim 1, where the plurality of surface-attachable devices includes devices from a group consisting of integrated circuit devices, active devices, passive devices, and/or photonics components.

8. The method of claim 1, where the multichip package substrate comprises one or more intervening insulation layers which isolate the one or more cavities of the substrate core from one another to insulate the plurality of embedded active and/or passive circuit components from one another.

9. The method of claim 1, wherein the one or more cavities of the substrate core comprises a plurality of cavities.

10. The method of claim 1, where the substrate core is formed with a first insulating material that is sandwiched between the first redistribution line stack and the second redistribution line stack.

11. The method of claim 10, where the first insulating material is selected from a group consisting of plastic or fiberglass.

12. The method of claim 9, where an embedded active circuit component is formed and positioned in at least one of the plurality of cavities of the multichip package substrate.

13. The method of claim 9, where an embedded passive circuit component is formed and positioned in at least one of the plurality of cavities of the multichip package substrate.

14. A method for making a package assembly, comprising:

attaching a first plurality of surface-attachable devices directly to a first temporary carrier, where the first plurality of surface-attachable devices have different heights and first interconnect surfaces facing the temporary carrier;

encapsulating the first plurality of surface-attachable devices with a molding compound material that completely covers the first plurality of surface-attachable devices;

curing the molding compound material to form a first panel of surface-attachable devices having different heights;

grinding or etching a backside surface of the first panel of surface-attachable devices to thin at least one of the first plurality of surface-attachable devices, thereby forming a thinned panel of surface-attachable devices which have a uniform height and which are exposed at a backside surface of the thinned panel of surface-attachable devices;

attaching a second temporary carrier directly to the backside surface of the thinned panel of surface-attachable devices;

removing the first temporary carrier from the thinned panel of surface-attachable devices to expose the first interconnect surfaces;

attaching a plurality of interconnect conductor structures to the first interconnect surfaces exposed on the thinned panel of surface-attachable devices;

singulating the thinned panel of surface-attachable devices into at least a first integrated circuit package comprising an encapsulated plurality of surface-attachable devices which have the uniform height, where the first integrated circuit package has a planar frontside surface with interconnect conductor structures connected to corresponding first interconnect surfaces, and where the first integrated circuit package has a planar heat dissipation surface exposing backsides of the encapsulated plurality of surface-attachable devices;

providing a multichip package substrate comprising a substrate core formed with an insulating material in which a plurality of cavities are formed with a plurality of embedded active and/or passive circuit components separately embedded in the plurality of cavities, wherein the plurality of embedded active and/or passive circuit components comprises circuit components selected from a group consisting of an integrated circuit capacitor or an integrated circuit die for implementing a specified power, RF, digital and/or photonic functionality, and wherein the plurality of embedded active and/or passive circuit components is positioned for alignment with a first surface-attachable device from the first plurality of surface-attachable devices to have a shadow within which at least one of the embedded active and/or passive circuit components is located;

attaching the planar frontside surface of the first integrated circuit package to a first surface of the multichip package substrate to make electric connection between the plurality of embedded active and/or passive circuit components and the encapsulated plurality of surface-attachable devices; and attaching a heat spreader lid to the planar heat dissipation surface of the first integrated circuit package so that the heat spreader lid is thermally connected to dissipate heat from the encapsulated plurality of surface-attachable devices through the planar heat dissipation surface.

* * * * *